United States Patent
Komori

(10) Patent No.: US 6,448,630 B1
(45) Date of Patent: Sep. 10, 2002

(54) SEMICONDUCTOR DEVICE COMPRISING A POLISH PREVENTING PATTERN

(75) Inventor: Shigeki Komori, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/292,383

(22) Filed: Apr. 15, 1999

(30) Foreign Application Priority Data

Oct. 15, 1998 (JP) .......................................... 10-293426

(51) Int. Cl.$^7$ ...................... H01L 21/76; H01L 21/304; H01L 23/053; H01L 23/12; H01L 21/00
(52) U.S. Cl. ...................... 257/625; 257/506; 257/510; 257/502; 257/649; 257/618; 257/619; 257/405; 257/620; 478/424; 478/425; 478/426; 478/427
(58) Field of Search ................................ 257/506, 510, 257/501, 649, 625, 618, 619, 605, 620; 438/424–426, 427

(56) References Cited

U.S. PATENT DOCUMENTS

| | | | | |
|---|---|---|---|---|
| 5,065,273 A | * | 11/1991 | Rajeevakumar | ............. 361/313 |
| 5,362,669 A | * | 11/1994 | Boyd et al. | ............. 437/67 |
| 5,459,096 A | * | 10/1995 | Venkatesan et al. | ............. 257/370 |
| 5,494,857 A | * | 2/1996 | Cooperman et al. | |
| 5,540,811 A | * | 7/1996 | Morita | ............. 156/636.1 |
| 5,633,190 A | | 5/1997 | Sugiyama | |
| 5,665,202 A | * | 9/1997 | Subramanian et al. | ............. 438/692 |
| 5,750,433 A | | 5/1998 | Jo | |
| 5,869,384 A | * | 2/1999 | Yu et al. | ............. 438/431 |
| 5,960,270 A | * | 9/1999 | Misra et al. | ............. 438/197 |
| 6,013,937 A | * | 1/2000 | Beintner et al. | ............. 257/513 |
| 6,043,133 A | * | 3/2000 | Jang et al. | ............. 438/401 |
| 6,084,276 A | * | 7/2000 | Gambino et al. | ............. 257/397 |
| 6,090,713 A | * | 7/2000 | Karlsson et al. | ............. 438/691 |
| 6,114,251 A | * | 9/2000 | Nguyen et al. | ............. 438/710 |

FOREIGN PATENT DOCUMENTS

| | | |
|---|---|---|
| JP | 8-83837 | 3/1996 |
| JP | 10-22376 | 1/1998 |
| JP | 11-330223 | * 11/1999 |
| WO | WO 96/15552 | 5/1996 |

* cited by examiner

Primary Examiner—Alexander O. Williams
(74) Attorney, Agent, or Firm—McDermott, Will & Emery

(57) ABSTRACT

A semiconductor device having a polish preventing pattern that can improve the planarity of an element formation region after the CMP method polishing is provided. To the shape of an element formation region, a loop-shaped element formation region dummy is formed in a uniform width and at a uniform distance from the edge of the element formation region to have a loop shape. That can prevent formation of such a portion that is on a line extended from a gap between polish preventing patterns as well as a large gap between an element formation region and a polish preventing pattern. Accordingly, local application of large pressure to an end of an element formation region is suppressed which is caused when a polishing cloth bends. As a result, the semiconductor device does not have a locally substantially etched portion. The planarity of the surface of an element formation region is maintained in the semiconductor device.

11 Claims, 23 Drawing Sheets

2 3

2 3 20

2 3

SEMICONDUCTOR DEVICE COMPRISING A POLISH PREVENTING PATTERN

BACKGROUND OF THE INVENTION

1. Field of the Invention

The present invention and a manufacturing method thereof relates to a semiconductor device having a polish preventing pattern. More particularly, the present invention relates to a semiconductor device having a polish preventing pattern for preventing an end of an element formation region to be shaved when an interlayer oxide film is planalized by the CMP method in a subsequent process because the element formation region formed by trench isolation at a surface of a semiconductor substrate is arranged so as to be isolated horizontally from other element formation regions.

2. Description of the Background Art

The LOCOS (LOCal Oxidation of Silicon) method for forming an isolation oxide film, which has a uniform film thickness, near a surface of a semiconductor substrate by thermally oxidizing a silicon substrate has been employed as a means of forming an element isolation region for isolating an element formation region of the semiconductor device. The LOCOS method has been an effective means of isolating an element formation regions in conventional semiconductor devices with a relatively lower degree of integration.

However, in the LOCOS method, a bird's beak is formed, which is thermal oxidation at an end of an element formation region along a main surface of a semiconductor substrate. When the LOCOS method is used for a semiconductor device in which small element formation regions are formed, the bird's beak may oxidize all of the element formation regions. Accordingly, the element formation regions may be lost, and therefore the LOCOS method cannot be applied to highly integrated semiconductor devices.

As a means of isolating an element formation region as an alternative to the LOCOS method, the trench isolation method in which an insulation film is filled in a trench that is provided in a silicon substrate has been used. In the trench isolation method, a silicon substrate is first shaved by anisotropic etching to form a trench to a prescribed depth from the main surface of the silicon substrate. An insulation film such as an oxide film is then filled in the trench to such an extent that the insulation film slightly rises from the main surface of the silicon substrate. Thereafter, the insulation film is polished to such an extent that the insulation film surface approaches the main surface of the silicon substrate. Thus, the main surface of the insulation film is planarized while the surface of the element formation region is exposed. An element isolation region is formed in this manner.

As a method of planalizing the insulation film surface, the CMP (Chemical Mechanical Polishing) method in which an isolation insulation film is filled and thereafter the entire surfaces of the silicon substrate and the isolation insulation film are chemically and mechanically polished is used. In the CMP method, the entire surfaces of a silicon substrate and an isolation insulation film are polished by introducing a polishing liquid on the surfaces of the silicon substrate and the isolation oxide film and rotating the silicon substrate while pressing a polishing cloth against the entire surfaces of the silicon substrate and the isolation insulation film.

The CMP method is characterized in that a protruding portion of a silicon substrate is polished first. When such a portion as an element formation region that is not to be polished protrudes, a protection film such as a nitride film is generally provided on its surface to prevent polishing of the protruded portion.

However, the polishing speed of an oxide film is considerably higher than that of a nitride film. Thus, the following problems occur in the CMP method polishing. Referring to FIGS. 38–48, typical problems with the CMP method polishing will be described in the following.

In the CMP method polishing, as can be seen from the states before and after polishing shown in FIGS. 38 and 39, the proportion of area in which nitride films 112a, 112b, 112c, 112d, 112e, 112f are distributed and the proportion of area in which oxide films 114a, 114b, 114c, 114d, 114e are distributed are greatly different between regions that have a high density of element formation regions, that is, a region between element formation regions 102a and 102b, a region between element formation regions 102b and 102c, a region between element formation regions 102d and 102e, a region between element formation regions 102e and 102f, and a region that has a low density of element formation regions, that is, a region between element formation regions 102c and 102d. Accordingly, a region having a large area proportion of nitride films is hardly shaved and keeps a planar surface while a region having a larger area proportion of oxide films is easily shaved and shaved to a greater extent toward its center. Thus, a dent $d_1$ is created as shown in FIG. 39. Dent $d_1$ affects formation of an aluminum interconnection and the like that are provided on oxide film 114c in a subsequent process.

As shown in FIG. 40, in the process of forming oxide film 114 to cover element formation regions 102a, 102b, the oxide film is deposited to the shape of protruding element formation regions 102a, 102b. Accordingly, the surface is roughened and have considerably large rise and falls as a whole. In order to etch the entire particularly protruded portion of oxide film 114, a slightly dented portion of oxide film 114 may slightly be excessively etched. When the oxide film is successively etched from the state of FIG. 40 to the states of FIGS. 41, 42, 43 and 44, nitride film 112 on an end of element formation region 102a and nitride film 113 formed on small element formation region 102b, which are under slightly dented oxide film 114, locally receive large pressure from a polishing cloth. Accordingly, the etching speed of nitride film 112 on the end of element formation region 102a and nitride film 113 formed on small element formation region 102b increases compared with the etching speed of nitride films at other portions. Thus, nitride film 112 on the end of element formation region 102a and nitride film 113 formed on small element formation region 102b are greatly shaved compared with nitride films at other portions and lose their function as a protection film. As a result, the end of element formation region 102a and small element formation region 102b are disadvantageously polished as shown in FIG. 45.

In order to prevent lowering of the function of nitride films 112, 113 as a protection film, a method using a polish preventing pattern is utilized. Referring to FIGS. 46–48, the method will be described in the following.

In the process of forming element formation region 102 as shown in FIG. 46 on semiconductor substrate 101, element formation region 102 is formed on silicon substrate 101 and, at the same time, a trench is formed in semiconductor substrate 101 by using the same mask. By leaving the main surface, island-type polish preventing patterns 111 as dummy patterns are formed in an element isolation region to have the same size and regular intervals regardless of the position of element formation region 102 as shown in FIG. 47.

By using this method, the surface of silicon substrate 101 has nitride films almost uniformly distributed on the entire surface not only on element formation region 102 but on a portion to be an element isolation region. Since the entire surfaces of element formation region 102 and the element isolation region are polished at an almost uniform etching speed, nitride film 112 on the end of element formation region 102a and nitride film 113 formed on small element formation region 102b as shown in FIGS. 44 and 45 are prevented from being shaved to a greater extent than other portions and losing the function as a protection film.

However, the above described island-type polish preventing patterns 111 are formed in the same size and at regular intervals regardless of the shape, position and size of element formation region 102. Accordingly, a polishing cloth gets into a gap between element formation regions 102 and a large gap between an element formation region and polish preventing pattern 111, and therefore large pressure is applied to the portions. Accordingly, such a portion 150 of an element formation region that is on a line extended from a gap between polish preventing patterns 111 as well as an end 160 of an element formation region on the side of such a portion that has a larger gap than another because of the positional relationship between polish preventing patterns 111 and element formation region 102 are greatly etched. It can be considered that these disadvantageous phenomena are caused because small polish preventing patterns 111 are arranged in the same size and at regular intervals regardless of the position of element formation region 102.

SUMMARY OF THE INVENTION

The present invention was made to solve the above described problems, and its object is to provide a semiconductor device having a polish preventing pattern for improving the planarity of an element formation region by intentionally arranging the polish preventing pattern to the shape of the element formation region and thereby reducing the possibility that the element formation region is partially etched when an isolation oxide film in a trench isolation structure is planarized by the CMP method.

A semiconductor device of the present invention includes a polish preventing pattern surrounding an element formation region, formed at a main surface of a semiconductor device, in substantially a continuous manner at an almost uniform distance horizontally from the outer edge of the element formation region.

According to such a structure, the polish preventing pattern of the present invention continuously surrounds an element formation region, and therefore such a gap does not exist that corresponds to a gap between the island-type polish preventing patterns described in the prior art. Since the polish preventing pattern of the present invention is provided at a prescribed distance from the outer edge of an element formation region, there is not a difference in the space between the island-type polish preventing patterns and the outer edge of the element formation region due to the position of the element formation region. Accordingly, in the polishing step using a polishing cloth such as the CMP method, disadvantageous polishing of part of the element formation region outer edge is suppressed. As a result, the planarity of the main surface of an element formation region can be improved.

In the semiconductor device of the present invention, it is preferred that the polish preventing pattern includes a remainder of the main surface of a semiconductor substrate, which is adjacent to a trench provided around the element formation region, at the main surface of the semiconductor substrate.

According to such a structure, an element formation region and the polish preventing pattern can be formed to have the same height. Therefore, in the polishing step using a polishing cloth, the surface of an element formation region is prevented from being polished more reliably and an insulation film is polished completely. Since the polish preventing pattern can be formed simultaneously with formation of a trench for element isolation, the polish preventing pattern can be formed without increasing the manufacturing steps.

In the semiconductor device of the present invention, it is more preferred that an insulation film is filled in a trench between the outer edge of an element formation region and the polish preventing pattern.

According to such a structure, the trench between the outer edge of the element formation region and the polish preventing pattern functions as an element isolation region.

In the semiconductor device of the present invention, it is preferred that the polish preventing pattern is formed at a prescribed distance from a conductive layer.

According to such a structure, an element formation region and the conductive layer are prevented from being short-circuited through the polish preventing pattern.

In the semiconductor device of the present invention, it is preferred that the polish preventing pattern is formed at a prescribed distance from the boundary of an impurity diffusion region.

According to such a structure, a disadvantageous phenomenon such as latch up caused through the polish preventing pattern or deterioration of the isolation characteristics can be suppressed in the boundary of an impurity diffusion region.

In the semiconductor device of the present invention, it is preferred that the polish preventing pattern further includes a polish preventing pattern for well-potential fixation formed to horizontally surround a well and fixed in potential by another electrode to fix the well potential.

According to such a structure, the polish preventing pattern for well-potential fixation is provided, and therefore the polish preventing pattern has the effect of improving the planarity of an element formation region and the function of fixing the well potential.

In the semiconductor device of the present invention, it is preferred that the polish preventing pattern includes a loop-shaped polish preventing pattern extending in a band shape.

According to such a structure, good insulation characteristics between adjacent element formation regions are maintained by forming an insulation film between an element formation region and the loop-shaped polish preventing pattern and between the loop-shaped polish preventing pattern and another element formation region.

In the semiconductor device of the present invention, it is more preferred that the polish preventing pattern includes a concavity formation preventing pattern formed at a distance from the loop-shaped polish preventing pattern with an insulation film therebetween.

According to such a structure, the concavity formation preventing pattern exists at the center of an element isolation region when element formations are formed largely spaced apart. Therefore, excessive polishing of the center of the element isolation region is suppressed, and the planarity of the element isolation region is improved.

In the semiconductor device of the present invention, it is more preferred that a pad for receiving signals is further formed on the concavity formation preventing pattern.

According to such a structure, the electrode pad is positioned on the concavity formation preventing pattern away from an element formation region, and the electric adverse effects of the signal receiving pad on conductive regions such as other element formation regions can be reduced.

In the semiconductor device of the present invention, it is more preferred that the loop-shaped polish preventing pattern has a discontinuous portion.

According to such a structure, the loop-shaped polish preventing pattern has a discontinuous portion, and therefore a conductive layer can be formed in the discontinuous portion. Therefore, the loop-shaped polish preventing pattern can be prevented from coming into contact with the conductive layer and, at the same time, an element formation region surrounded by the loop-shaped polish preventing pattern can electrically be connected to another element formation region or the conductive layer.

When element formation regions and the loop-shaped polish preventing pattern are close to each other, the element formation regions are electrically connected through the loop-shaped polish preventing pattern, and therefore the isolation characteristics may be lowered.

In the semiconductor device of the present invention, however, the loop-shaped polish preventing pattern is divided into at least two portions when the loop-shaped polish preventing pattern has at least two discontinuous portions. Accordingly, at least two element formation regions can be surrounded by at least two portions of one loop-shaped polish preventing pattern. Since electric connection is disconnected by the discontinuous portions at this time, electric connection between element formation regions through the loop-shaped polish preventing pattern can be suppressed. As a result, the isolation characteristics of the element formation regions are improved.

In the semiconductor device of the present invention, it is preferred that the polish preventing pattern includes another loop-shaped polish preventing pattern outside the above described loop-shaped polish preventing pattern.

According to such a structure, by an arbitrary combination of patterns selected from the group of a loop-shaped polish preventing pattern not having a discontinuous portion and a loop-shaped polish preventing pattern having a discontinuous portion, the loop-shaped polish preventing pattern is at least doubly formed horizontally for one element formation region. Accordingly, the isolation characteristics between element formation regions are further improved.

Further, the outer loop-shaped polish preventing pattern suppresses polishing of the inner loop-shaped polish preventing pattern. Accordingly, the possibility that an end of an element formation region is polished in the polishing step using a polishing cloth is further reduced, and the planarity of an element formation region is further improved.

If the loop-shaped polish preventing patterns having a discontinuous portion are used, an element formation region surrounded by the loop-shaped polish preventing portions can electrically be connected to another element formation region or a conductive layer.

A method of manufacturing a semiconductor device of the present invention includes the steps of forming a trench to a prescribed depth from a main surface of a semiconductor substrate around an element formation region of the semiconductor substrate having the main surface thereby forming a polish preventing pattern having a remainder of the main surface to surround the element formation region in a substantially continuous manner at an almost uniform distance horizontally from the outer edge of the element formation region, forming an insulation film to cover the trench, the polish preventing pattern and the surface of the element formation region, and polishing and removing the insulation film using a polishing cloth till the main surface of the element formation region is exposed.

According to the manufacturing in such steps, excessive polishing of part of an element formation region is suppressed in the polishing step using a polishing cloth. As a result, the planarity of an element formation region of a semiconductor device to be manufactured is improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiments of the present invention will be described in the following with reference to the drawings.

First Embodiment

Figure 1:
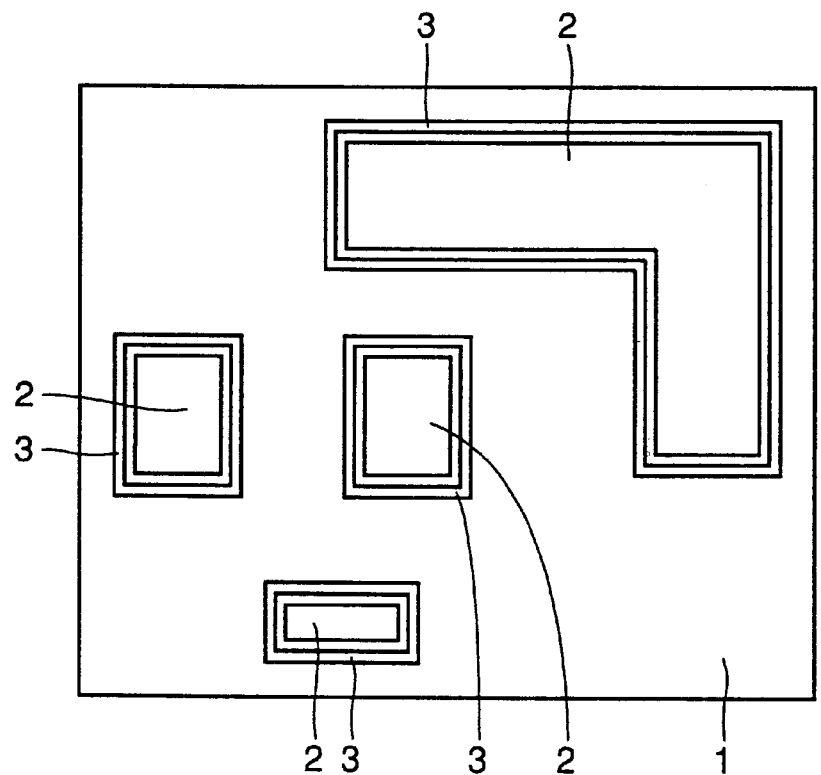
FIG. 1 is a plan view of a pattern in which a loop-shaped polish preventing pattern described in a first embodiment of the present invention is formed around an element formation region.

A semiconductor device having a polish preventing pattern in a first embodiment of the present invention will be described with reference to FIGS. 1–7. In the semiconductor device in this embodiment, element formation regions of different sizes and shapes are provided on a semiconductor substrate 1 as shown in FIG. 1. At a uniform distance from the outer edge of element formation region 2, a loop-shaped polish preventing pattern 3 having a uniform width is formed to surround element formation region 2. Element formation region 2 and loop-shaped polish preventing pattern 3 are formed by forming trenches in semiconductor substrate 1 so as to leave the surface of semiconductor substrate 1.

Figure 48:
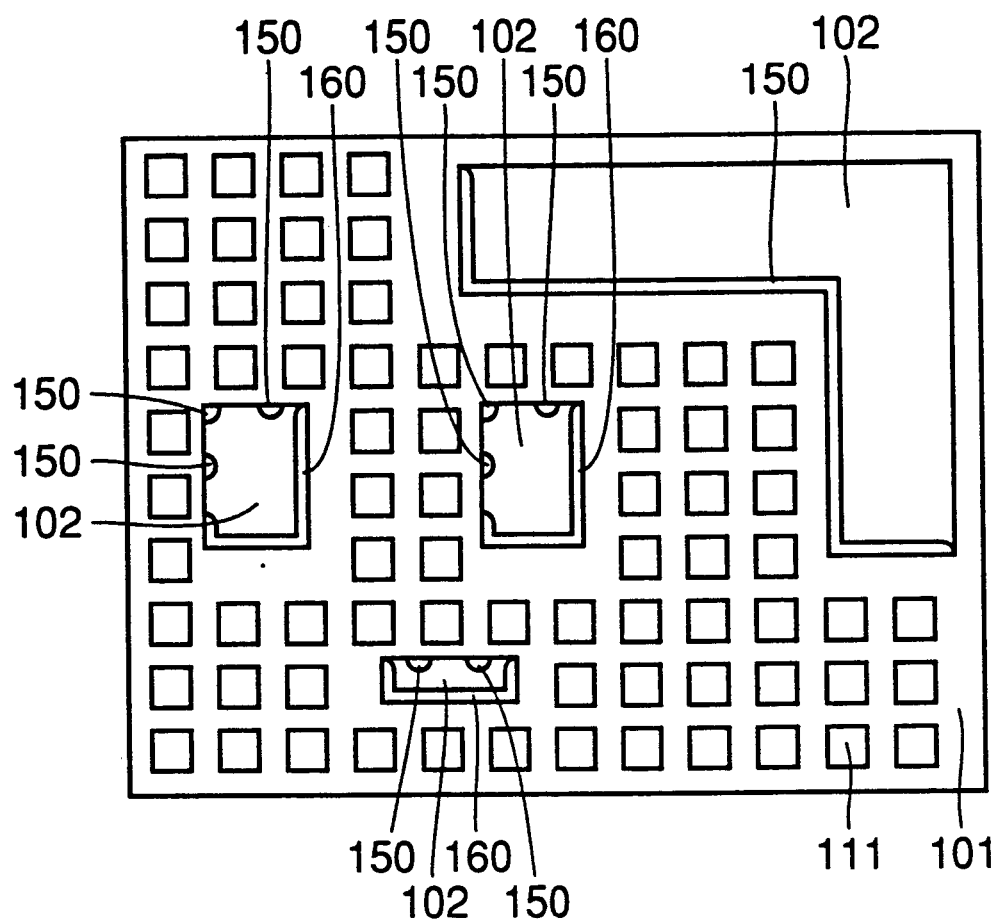
FIG. 48 is a plan view showing a state in which an end of an element formation region is shaved when conventional polish preventing patterns formed in the same size and at equal intervals regardless of the shape, size and position of an element formation region are polished using the CMP method.

Since loop-shaped polish preventing pattern 3 is arranged around element formation region 2 in a uniform width and at a uniform distance in this manner, such a portion that is on a line extended from a gap between polish preventing patterns 111 as described in FIG. 48 in the conventional art is not formed. Further, formation of a large gap between element formation region 2 and polish preventing pattern 111 can be prevented which is caused when a plurality of polish preventing patterns 111, shown in FIG. 48, smaller than the element formation region are arranged regardless of the arrangement of the element formation region.

Figure 2:
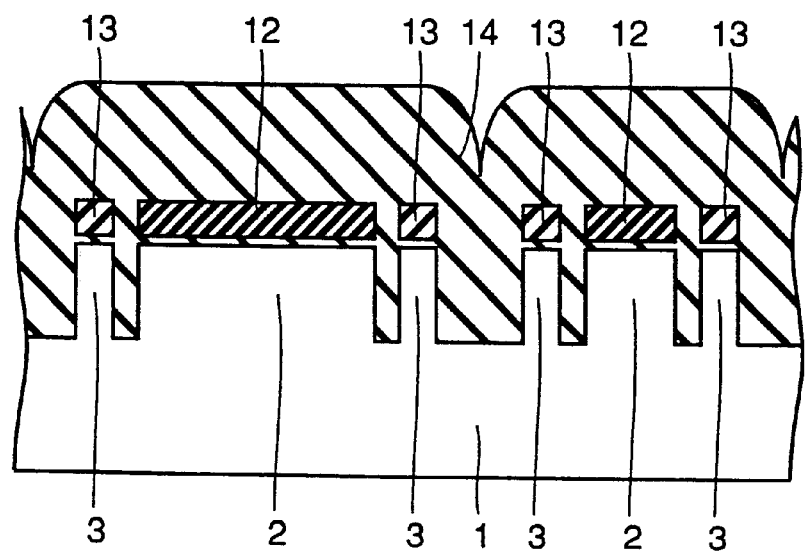
FIG. 2 is a cross sectional view of a pattern in which the loop-shaped polish preventing pattern described in the first embodiment is formed around the element formation region and an oxide film is formed thereon.
Figure 3:
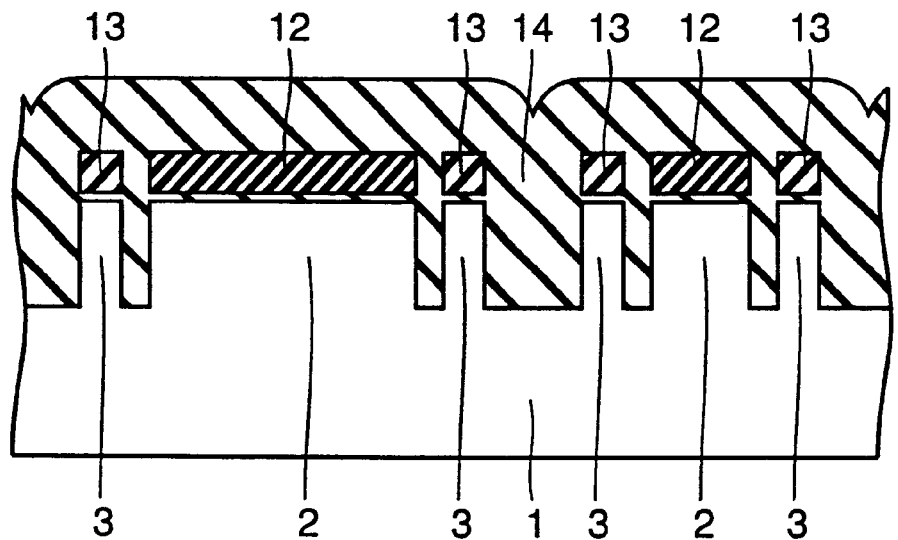
FIG. 3 is a cross sectional view of a pattern in which the loop-shaped polish preventing pattern described in the first embodiment is formed around the element formation region and the oxide film thereon is polished.
Figure 4:
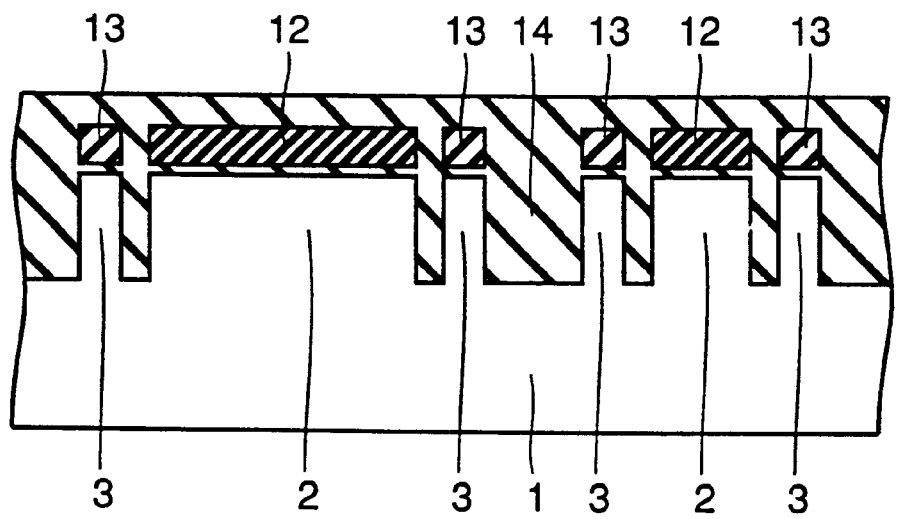
FIG. 4 is a cross sectional view showing a state in which the loop-shaped polish preventing pattern described in the first embodiment is formed around the element formation region and the oxide film thereon is being polished.
Figure 5:
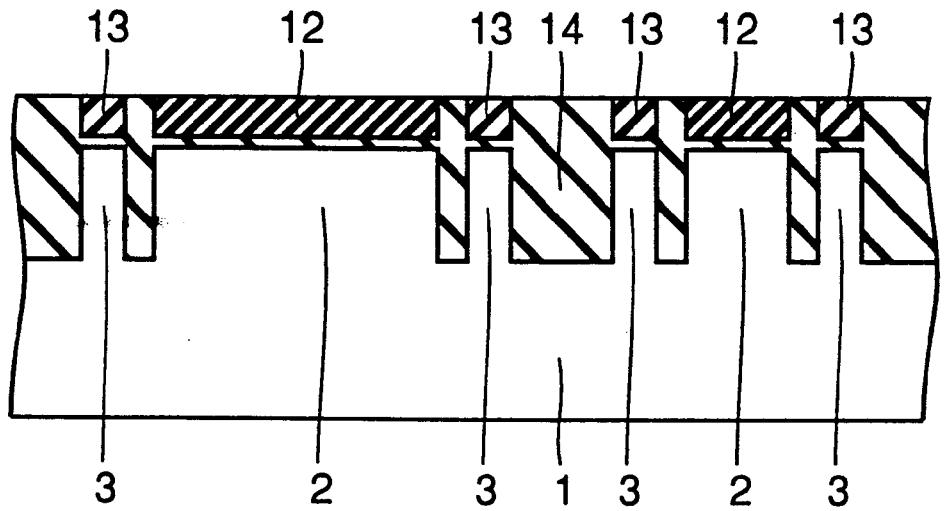
FIG. 5 is a cross sectional view showing a state in which the loop-shaped polish preventing pattern described in the first embodiment is formed around the element formation region and the oxide film thereon is polished to the top surface of a nitride film.
Figure 6:
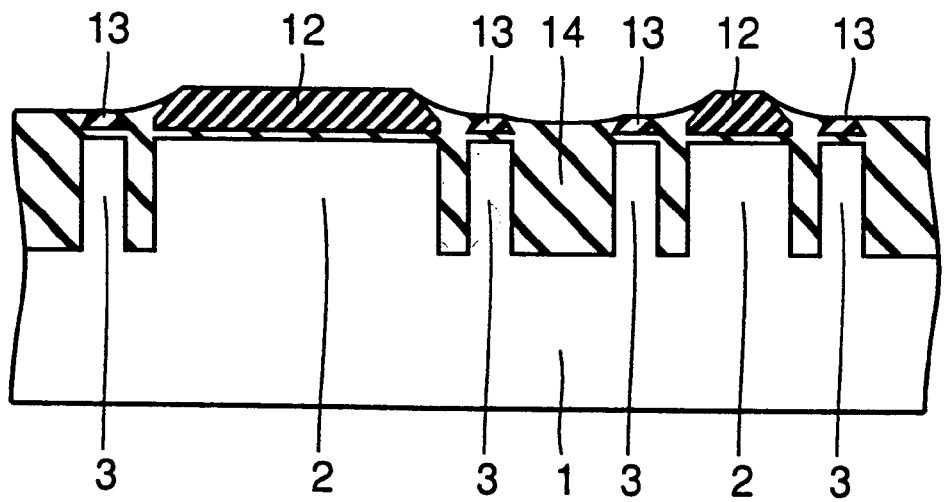
FIG. 6 is a cross sectional view showing a state in which the loop-shaped polish preventing pattern described in the first embodiment is formed around the element formation region and an end of the nitride film thereon is polished.
Figure 7:
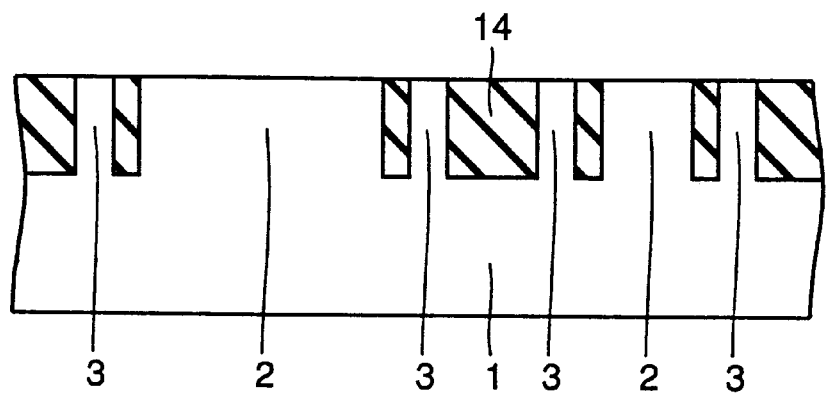
FIG. 7 is a cross sectional view showing a state in which the interlayer oxide film and the nitride film formed on the loop-shaped polish preventing pattern described in the first embodiment and the element formation region are polished.

Accordingly, when an oxide film 14 serving as an isolation insulation film is formed to cover element formation region 2 and polish preventing pattern 3 as shown in FIG. 2, and oxide film 14 serving as an isolation oxide film is polished to the surface of element formation region 2 and to the surface of polish preventing pattern 3 as shown in FIGS. 3–7, polish preventing pattern 3 uniformly bears the pressure of a polishing cloth around element formation region 2 in the CMP process. Thus, the polishing cloth bends and local application of large pressure to an end of element formation region 2 is prevented. Accordingly, element formation region 2 in this embodiment shown in FIG. 1 does not have a portion locally and greatly etched in the process of carrying out the CMP method. As a result, a semiconductor device of which surface planarity of an element formation region is maintained is obtained.

Second Embodiment

Figure 8:
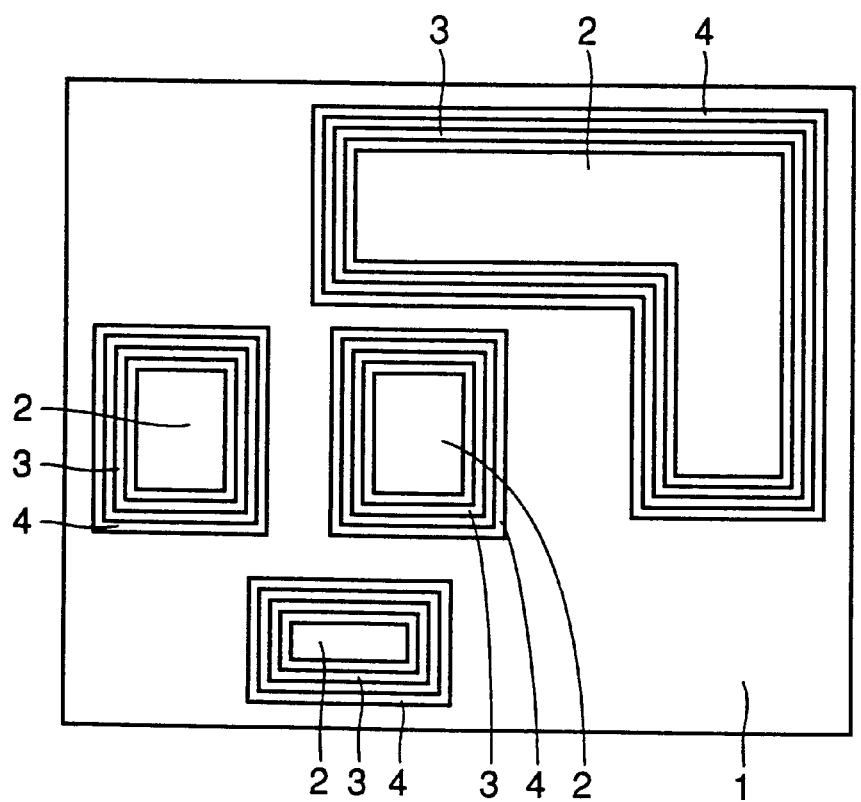
FIG. 8 is a plan view of a pattern in which a loop-shaped polish preventing pattern described in a second embodiment of the present invention is doubly formed around an element formation region.

A semiconductor device having a polish preventing pattern in a second embodiment of the present invention will be described with reference to FIGS. 8–11. Similarly to the first embodiment, in the semiconductor device in this embodiment, element formation regions 2 of different sizes and shapes are formed on semiconductor substrate 1, and loop-shaped polish preventing pattern 3 having a uniform width is formed at a uniform distance from the outer edge of element formation region 2 as shown in FIG. 8. Further, a loop-shaped polish preventing pattern 4 having a uniform width is formed at a uniform distance from the outer edge of loop-shaped polish preventing pattern 3. Element formation region 2 and loop-shaped polish preventing patterns 3, 4 are formed by forming trenches in semiconductor substrate 1 so as to leave the surface of semiconductor substrate 1.

Figure 9:
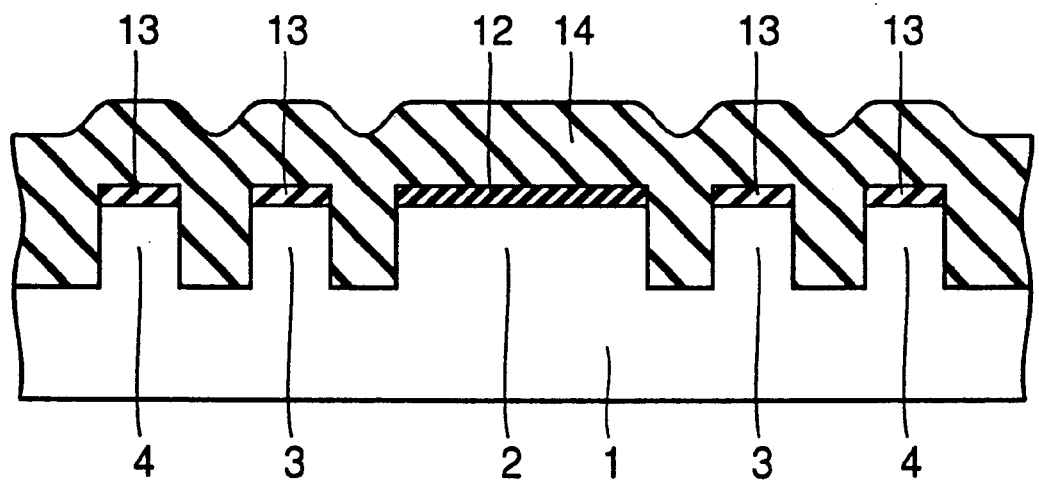
FIG. 9 is a cross sectional view of a pattern in which the double loop-shaped polish preventing pattern described in the second embodiment is formed around the element formation region and an oxide film is formed thereon.
Figure 10:
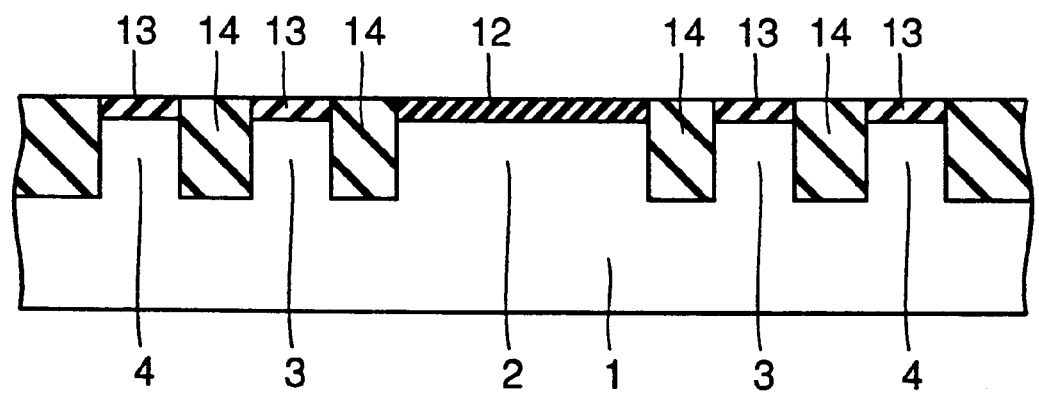
FIG. 10 is a cross sectional view showing a state in which the oxide film formed on the double loop-shaped polish preventing pattern described in the second embodiment and the element formation region is polished to the surfaces thereof.

According to such a structure, loop-shaped polish preventing pattern 4 is further provided around loop-shaped polish preventing pattern 3. Accordingly, when an interlayer oxide film 14 is formed to cover element formation region 2 and loop-shaped polish preventing patterns 3, 4 as shown in FIG. 9, and interlayer oxide film 14 is polished to the surfaces of element formation region 2 and loop-shaped polish preventing patterns 3, 4 as shown in FIG. 10 in the CMP process, the pressure of a polishing cloth received around element formation region 2 can be shared by loop-shaped polish preventing patterns 3, 4.

Thus, an end of element formation region 2 is protected by two loop-shaped polish preventing patterns 3, 4. Therefore, the possibility that the end of element formation region 2 or the entire surface of element formation region 2 are polished because loop-shaped polish preventing pattern 3 is polished by a polishing cloth in the first embodiment can be reduced. As a result, a semiconductor device of which surface planarity of element formation region 2 is more accurately maintained is obtained.

Figure 11:
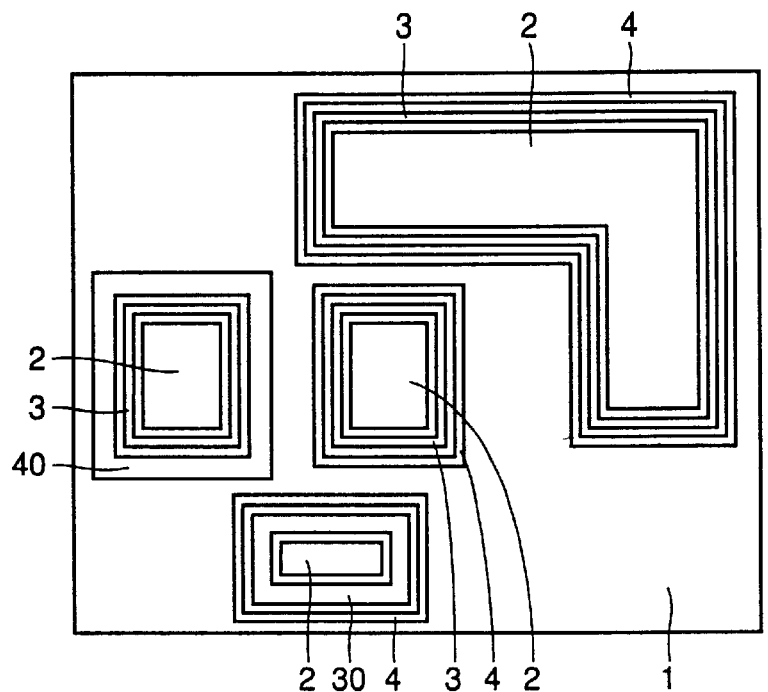
FIG. 11 is a plan view of a pattern in which a loop-shaped polish preventing pattern having different thicknesses described in the second embodiment is doubly formed around an element formation region.

Although loop-shaped polish preventing patterns 3, 4 are formed to have the same width in this embodiment, there may be a difference in width of loop-shaped polish preventing patterns 3, 4 as shown in FIG. 11. In this case, the protection effect of an element formation region becomes higher as loop-shaped polish preventing patterns 3, 4 are wider. Further, the distance between loop-shaped polish preventing patterns 3, 4 are varied according to the size and polishing amount of element formation region 2.

Third Embodiment

Figure 12:
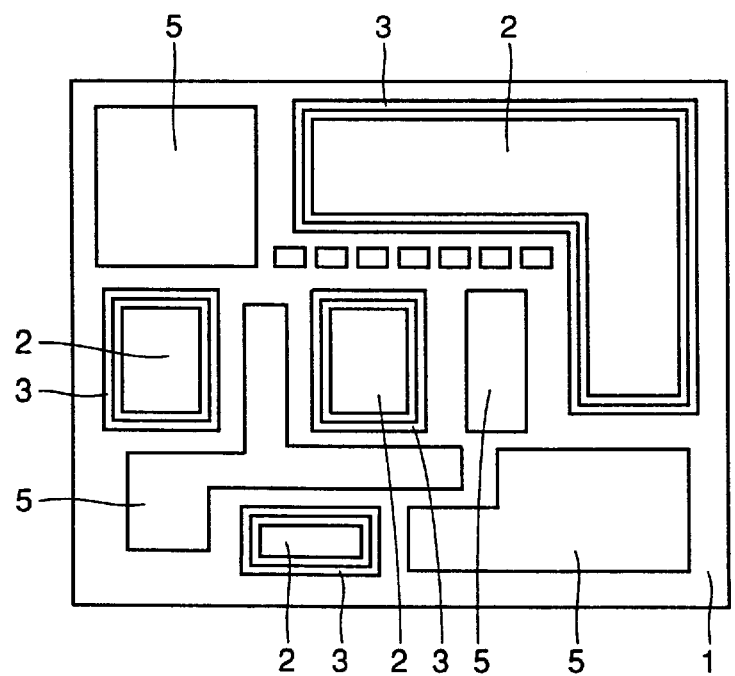
FIG. 12 is a plan view of a pattern in which a loop-shaped polish preventing pattern and a concavity formation preventing pattern described in a third embodiment of the present invention are formed around or outside an element formation region.

A semiconductor device having a polish preventing pattern in a third embodiment of the present invention will be described with reference to FIGS. 12 and 13. In the semiconductor device in this embodiment, a concavity formation preventing pattern 5 is formed in a large area region in an element isolation region for isolating element formation region 2, in addition to loop-shaped polish preventing pattern 3 described in the first embodiment, as shown in FIG. 12. In FIG. 12, a region between loop-shaped polish preventing pattern 3 and concavity formation preventing pattern 5 is for a gate electrode to be formed on an isolation insulation film in a subsequent process. Element formation region 2, loop-shaped polish preventing patterns 3, 4 and concavity formation preventing pattern 5 are formed by forming trenches in semiconductor substrate 1 so as to leave the surface of semiconductor substrate 1.

Figure 39:
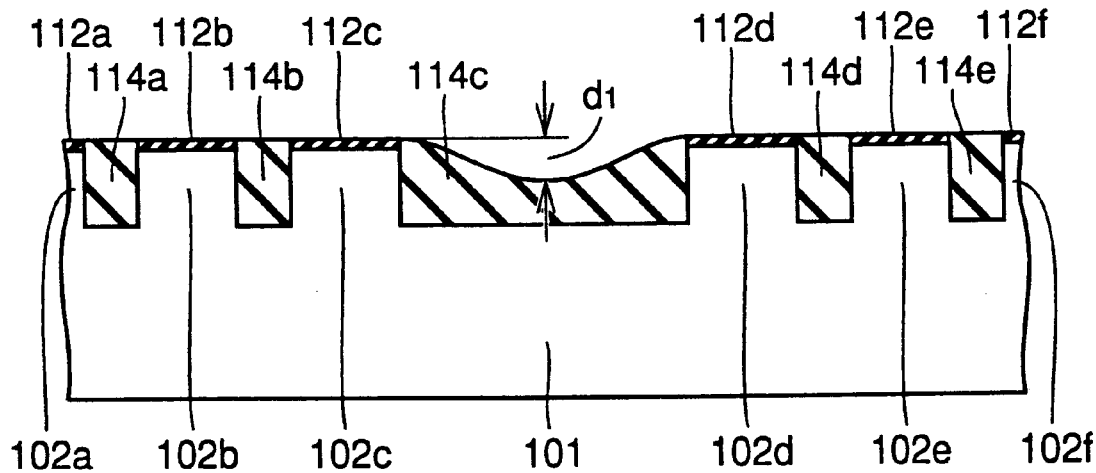
FIG. 39 is a cross sectional view showing a state in which a dent remains at the center of an insulating film after the insulation film is polished while the insulation film is greatly dented at a portion without a polish preventing pattern in a process of polishing the insulation film to form an element isolation region using the conventional CMP method.
Figure 40:
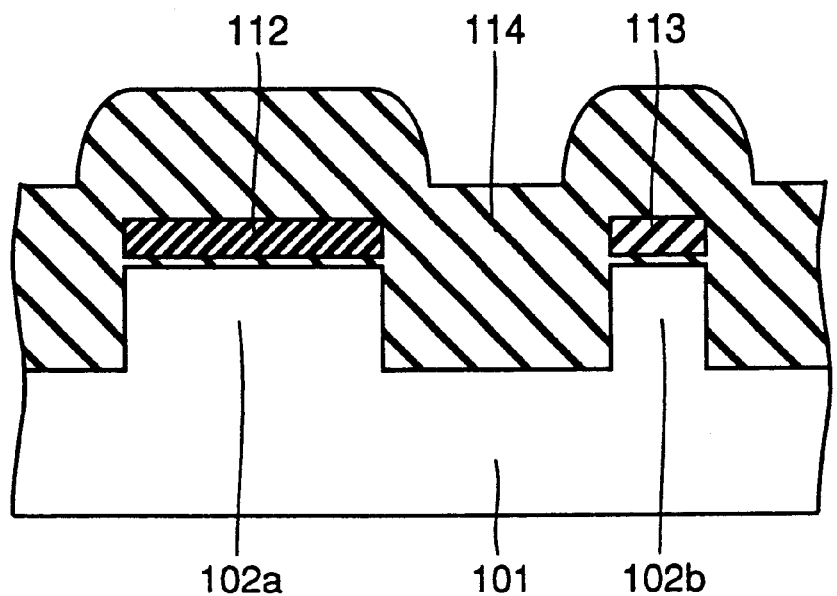
FIG. 40 is a cross sectional view showing a state before an insulation for forming an element isolation region is polished using the conventional CMP method.
Figure 41:
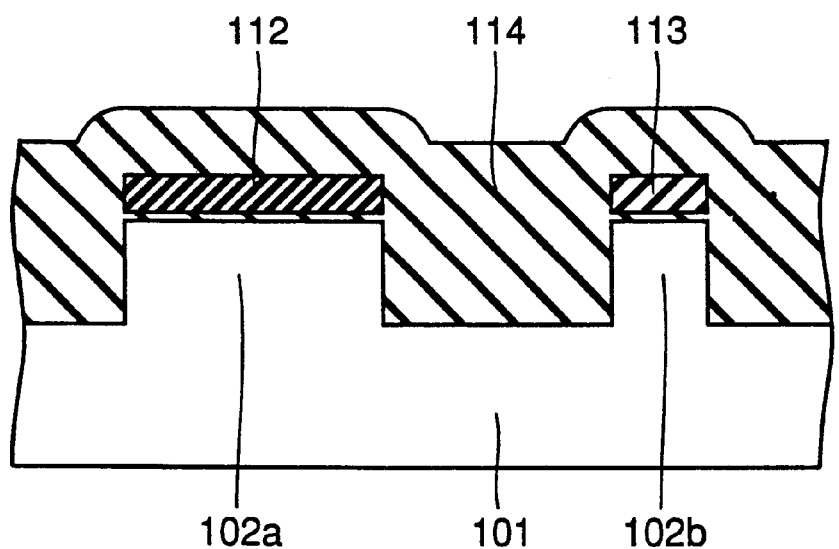
FIG. 41 is a cross sectional view showing a state in which the insulation film for forming an element isolation region is polished using the conventional CMP method.
Figure 42:
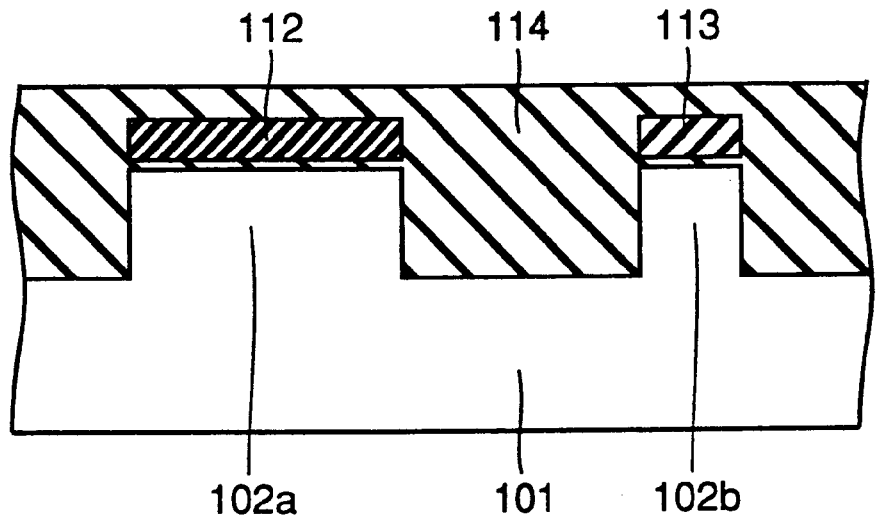
FIG. 42 is a cross sectional view showing a state in which the insulation film for forming an element isolation region is further polished from FIG. 41 using the conventional CMP method.
Figure 43:
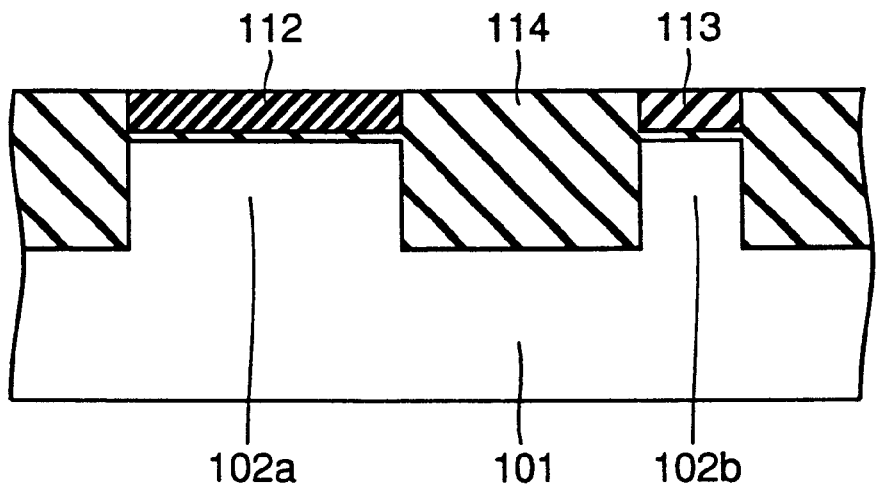
FIG. 43 is a cross sectional view showing a state in which the insulation film for forming an element isolation region is polished to the surface of an protection film using the conventional CMP method.
Figure 44:
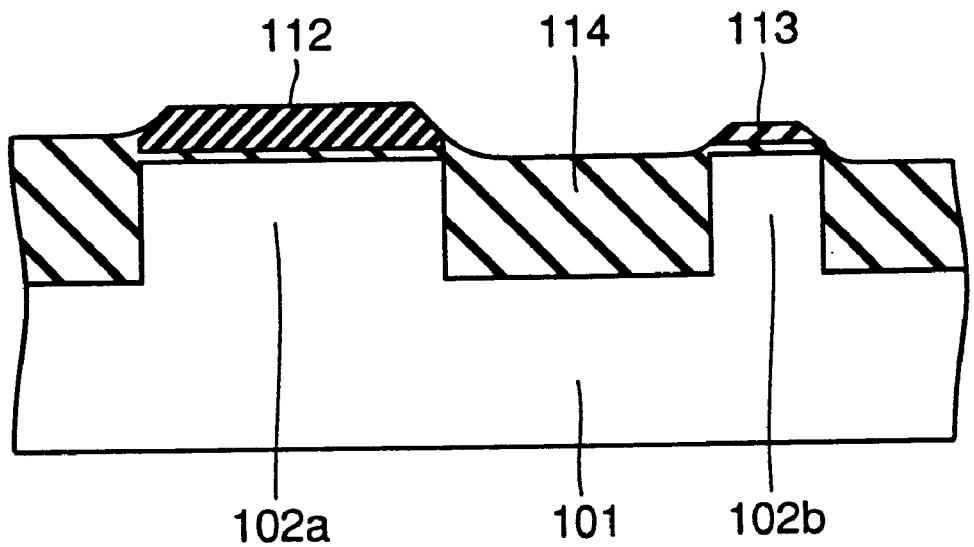
FIG. 44 is a cross sectional view showing a state in which the insulation film for forming an element isolation region is further polished to the surface of the protection film using the conventional CMP method and a protection film on an end of the element formation region and a protection film on a polished preventing pattern are polished.
Figure 45:
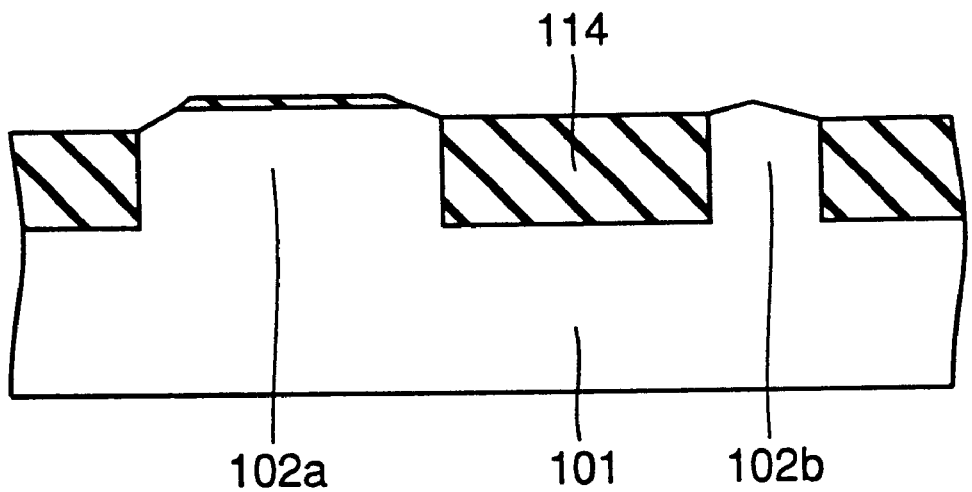
FIG. 45 is a cross sectional view showing a state in which the protection film on the element formation region is greatly polished in a step for polishing the insulation film to form an element isolation region using the conventional CMP method.
Figure 46:
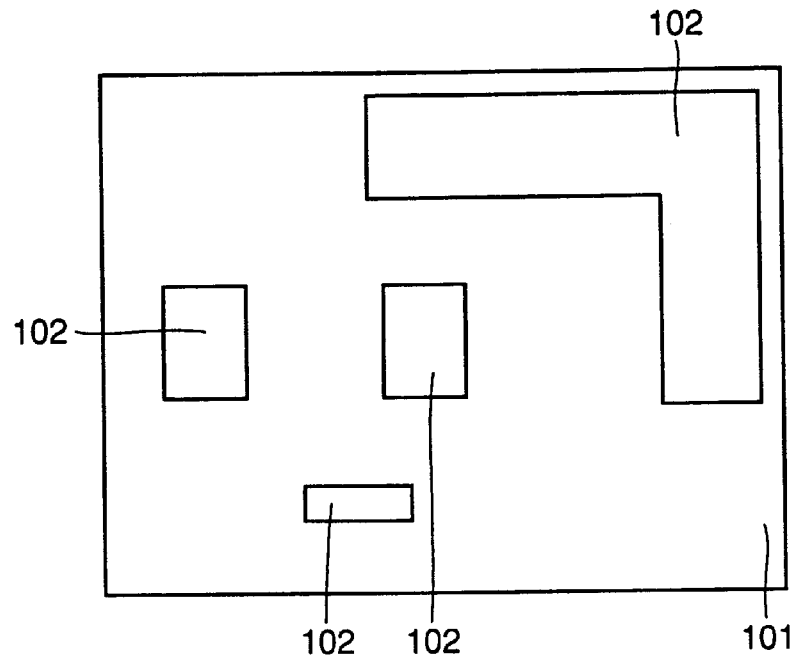
FIG. 46 is a plan view of a pattern of an element formation region.
Figure 47:
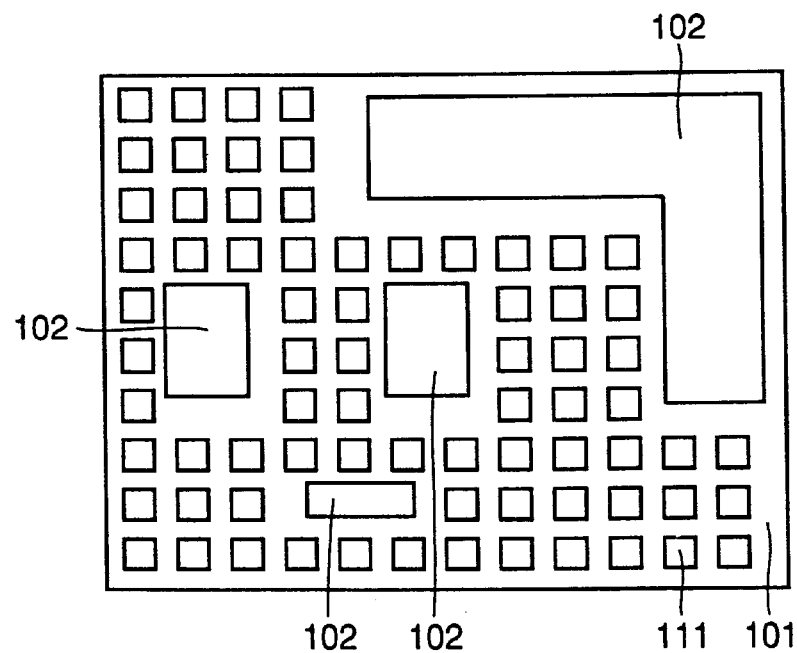
FIG. 47 is a plan view showing a state in which conventional identical polish preventing patterns are formed in the same size and at equal intervals regardless of the shape, size and position of an element formation region.

According to such a structure, concavity formation preventing pattern 5 is efficiently formed in an element isolation region having a large area other than a region in which a gate electrode is to be formed. That can reduce the possibility of formation of dent $d_1$ in isolation oxide film 114c, as shown in FIG. 39 of the conventional art, that affects formation of an aluminum interconnection and the like in a subsequent process. As a result, a semiconductor device can be provided in which the possibility that the end of an element formation region and the surface of a small element formation region are etched can be reduced in a process of carrying out the CMP method, and an element isolation region having a higher planarity can be formed after the CMP method.

Figure 13:
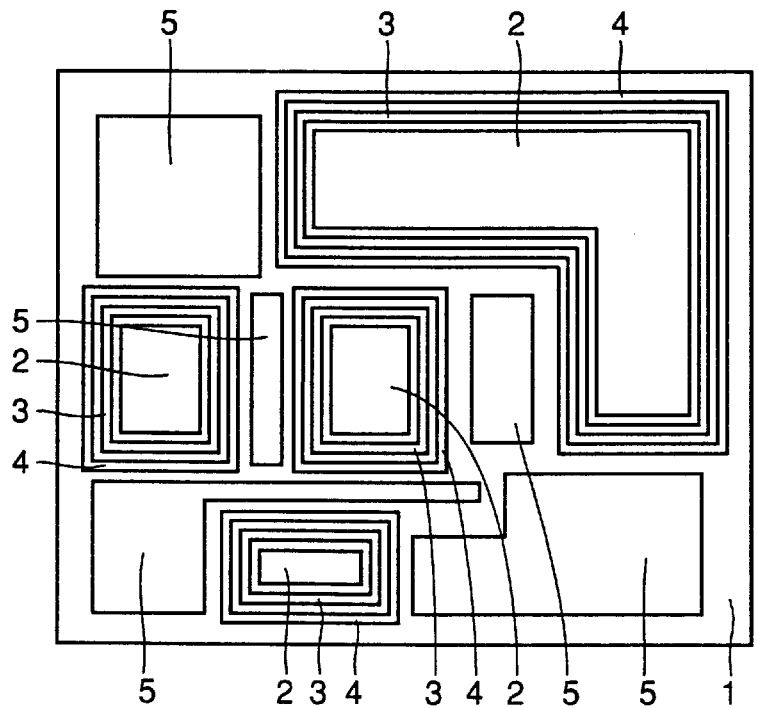
FIG. 13 is a plan view of a pattern in which a double loop-shaped polish preventing pattern and a concavity formation preventing pattern described in the third embodiment are formed around or outside an element formation region.

Since loop-shaped polish preventing patterns 3, 4 described in the second embodiment are combined with concavity formation preventing pattern 5 in this embodiment as shown in FIG. 13, a semiconductor device can be provided in which the possibility that the end of an element formation region and the surface of a small formation region are etched can be reduced in a process of carrying out the CMP method by two loop-shaped polish preventing patterns 3, 4 and the possibility that a dent, which affects formation of an aluminum interconnection and the like in a subsequent process, is formed at the center of an isolation oxide film can be reduced.

Since isolation oxide film 14 is further provided between loop-shaped polish preventing patterns 3 and 4, the isolation characteristics between element formation regions 2 are improved as compared with the case in which one loop-shaped polish preventing pattern is formed to have a width corresponding to the combined width of three of loop-shaped polish preventing patterns 3, 4 and isolation oxide film 14.

Fourth Embodiment

Figure 14:
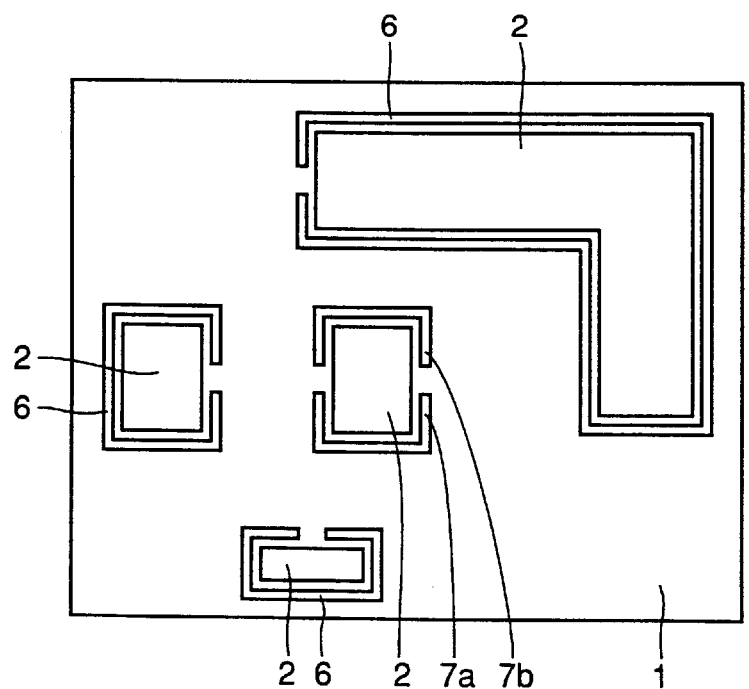
FIG. 14 is a plan view of a pattern in which a loop-shaped polish preventing pattern having a discontinuous portion described in a fourth embodiment of the present invention is formed around an element formation region.

A semiconductor device having a polish preventing pattern in a fourth embodiment of the present invention will be described with reference to FIGS. 14, 15 and 16. In the semiconductor device in this embodiment, a loop-shaped polish preventing pattern 6 that corresponds to loop-shaped polish preventing pattern 3 shown in FIG. 1 of the first embodiment provided with one discontinuous portion, and loop-shaped polish preventing patterns 7a, 7b that correspond to loop-shaped polish preventing pattern 3 provided with two discontinuous portions are provided in a uniform width and at a uniform distance from the outer edge of element formation region 2. Element formation region 2, loop-shaped polish preventing patterns 6, 7a, 7b are formed by forming trenches in semiconductor substrate 1 so as to leave the surface of semiconductor substrate 1.

According to the structure, element formation region 2 can be connected to another element formation region by providing the discontinuous portions of loop-shaped polish preventing patterns 6, 7a, 7b to be crossed by an interconnection layer.

Figure 15:
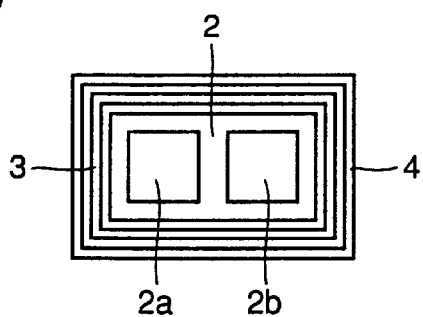
FIG. 15 is a plan view of a pattern in which the loop-shaped polish preventing pattern described in the fourth embodiment is doubly formed around source/drain regions.
Figure 16:
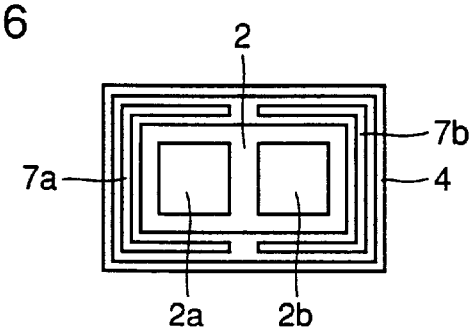
FIG. 16 is a plan view of a pattern in which the loop-shaped polish preventing pattern having a discontinuous portion described in the fourth embodiment is formed around source/drain regions and a loop-shaped element formation region is further formed around the loop-shaped polish preventing pattern.

When at least two element formation regions are formed in one loop-shaped polish preventing pattern, that is, when source/drain regions 2a, 2b are formed in element formation region 2 and element formation region 2 is formed in loop-shaped polish preventing patterns 3, 4 as shown in FIG. 15, for example, electric connection between source/drain regions 2a, 2b can be suppressed and the isolation characteristics can be ensured by using open-loop shaped polish preventing patterns 7a, 7b as shown in FIG. 16 instead of loop-shaped polish preventing pattern 3.

In the case of FIG. 15, since source/drain regions 2a, 2b are closely arranged to loop-shaped polish preventing pattern 3, loop-shaped polish preventing pattern 3 and source/drain regions 2a, 2b may electrically be short-circuited. Thus, source/drain regions 2a, 2b may be short circuited each other by loop-shaped polish preventing pattern 3.

In this case, loop-shaped polish preventing patterns 7a, 7b having two discontinuous portions are arranged around source/drain regions 2a, 2b in a uniform width and at a uniform distance from source/drain region 2a, 2b in this embodiment, as shown in FIG. 16. Since loop-shaped polish preventing patterns 7a, 7b are disconnected from each other at this time, electric connection is disconnected. Since there is no possibility of causing a short circuit by loop-shaped polish preventing patterns 7a, 7b having two discontinuous portions, the isolation characteristics between source/drain regions 2a and 2b are improved.

Fifth Embodiment

Figure 17:
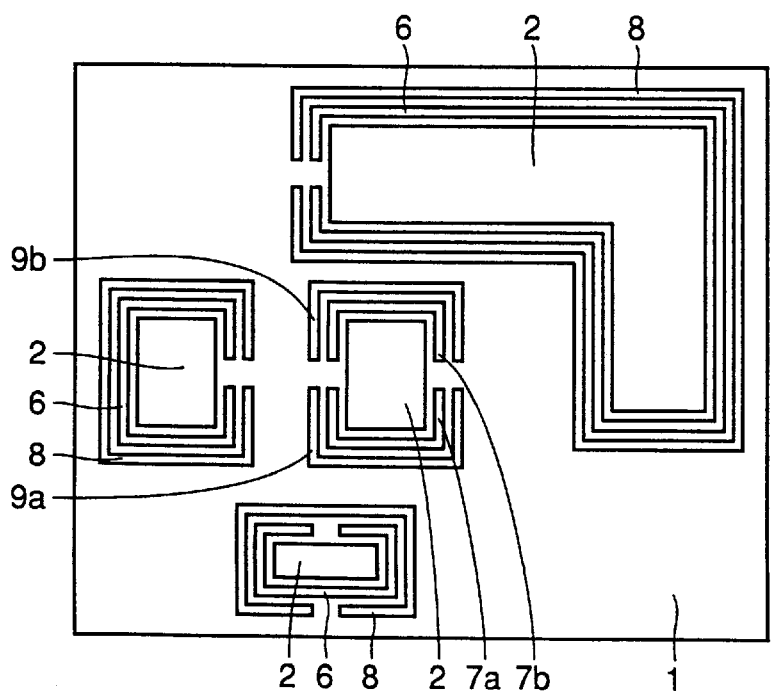
FIG. 17 is a plan view of a pattern in which a loop-shaped polish preventing pattern described in a fifth embodiment of the present invention is doubly formed around an element formation region.

A semiconductor device having a polish preventing pattern in a fifth embodiment of the present invention will be described with reference to FIG. 17. In the semiconductor device in this embodiment, loop-shaped polish preventing patterns 7a, 7b having two discontinuous portions or loop-shaped polish preventing pattern 6 having one discontinuous portion is formed on semiconductor substrate 1 in a uniform width and at a uniform distance from the outer edge of element formation region 2 as described in the fourth embodiment, as shown in FIG. 17.

Further, polish preventing patterns 9a, 9b having two discontinuous portions or a loop-shaped polish preventing pattern 8 having one discontinuous portion is formed in a uniform width and at a uniform distance from the outer edge of loop-shaped polish preventing patterns 7a, 7b having two discontinuous portions or the edge of loop-shaped polish preventing pattern 6 having one discontinuous portion. Element formation region 2, loop-shaped polish preventing patterns 6, 7a, 7b, 8, 9a, 9b are formed by forming trenches in semiconductor substrate 1 so as to leave the surface of semiconductor substrate 1.

According to the structure, the polish prevention and isolation characteristics of the end of element formation region 2 can be improved, as described in the second embodiment, by doubly providing the loop-shaped polish preventing patterns and, at the same time, connection to a region or an interconnection having another conductivity type, as described in the fourth embodiment, can be made possible by using loop-shaped polish preventing patterns 7a, 7b, 9a, 9b having a discontinuous portion.

Even when the source/drain regions as described in the fourth embodiment are formed in element formation region 2, the isolation characteristics of the source/drain regions can be maintained by using loop-shaped polish preventing patterns 7a, 7b inside loop-shaped polish preventing patterns 8, 9a, 9b.

Sixth Embodiment

Figure 18:
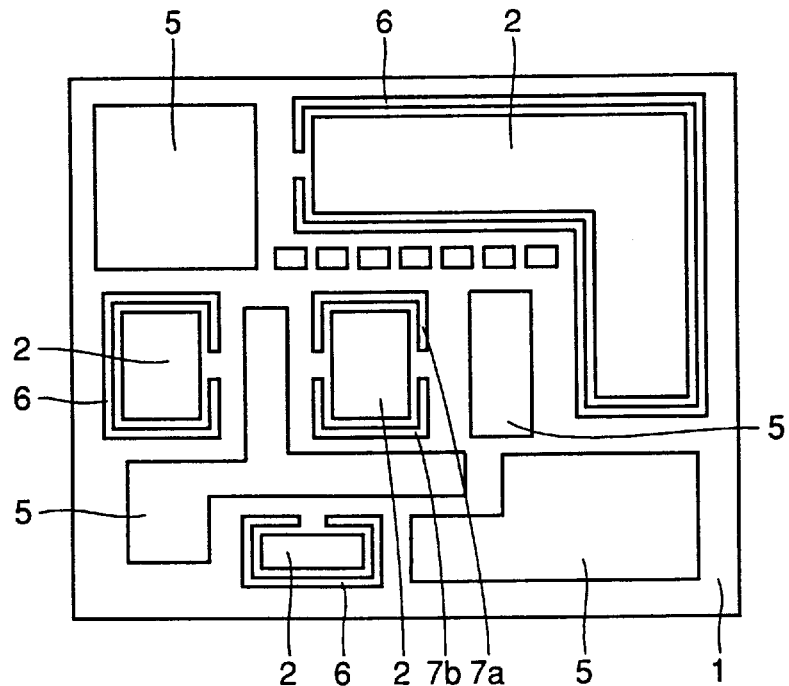
FIG. 18 is a plan view of a pattern in which a loop-shaped polish preventing pattern having a discontinuous portion and a concavity formation preventing pattern described in a sixth embodiment of the present invention are formed around or outside an element formation region.

A semiconductor device having a polish preventing pattern in a sixth embodiment of the present invention will be described with reference to FIGS. 18 and 19. In the semiconductor device in this embodiment, a combination of loop-shaped polish preventing patterns 7a, 7b having two discontinuous portions 7a, 7b or loop-shaped polish preventing pattern 6 having one discontinuous portion formed in a uniform width and at a uniform distance from the outer edge of element formation region 2 similarly to the ones shown in FIGS. 14 and 17 of the fourth embodiment, and concavity formation preventing pattern 5 as shown in FIGS. 12 and 13 of the third embodiment is provided on semiconductor substrate 1 as shown in FIG. 18. Element formation region 2, loop-shaped polish preventing patterns 6, 7a, 7b, and concavity formation preventing pattern 5 are formed by forming trenches in semiconductor substrate 1 so as to leave the surface of semiconductor substrate 1.

According to the structure, in the semiconductor device shown in FIG. 18, the effects of polish prevention of the end of element formation region 2 and the surface of small element formation region 2, connection to another element formation region 2, and prevention of electric connection between element formation regions 2 can be attained in a process of carrying out the CMP method as described in the fourth embodiment and, at the same time, the effect of forming an element isolation region having a higher planarity even in a process after implementation of the CMP method can be attained as described in the third embodiment.

Figure 19:
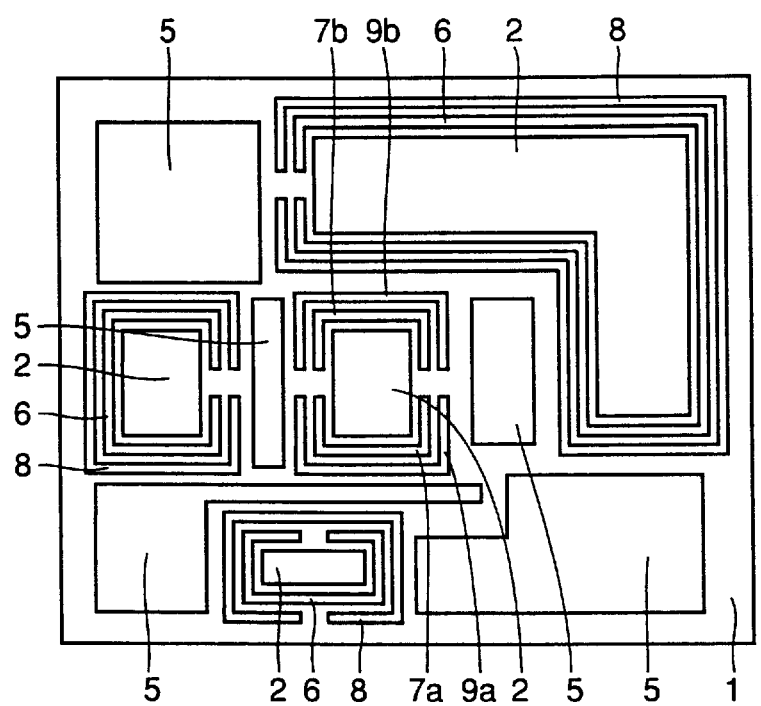
FIG. 19 is a plan view of a pattern in which the double loop-shaped polish preventing pattern and the concavity formation preventing pattern described in the sixth embodiment are formed around or outside an element formation region.

In the semiconductor device shown in FIG. 19, loop-shaped polish preventing patterns 9a, 9b having two discontinuous portions or loop-shaped polish preventing pattern 8 having one discontinuous portion is formed in a uniform width and at a uniform distance from the outer edge of loop-shaped polish preventing patterns 7a, 7b or the edge of loop-shaped polish preventing pattern 6.

According to the structure, loop-shaped polish preventing patterns 6, 7a, 7b formed inside are polished, and therefore the possibility element formation region 2 is polished can be reduced and the planarity of the surface of element formation region 2 can be maintained more accurately. When an isolation oxide film is formed between loop-shaped polish preventing patterns 6, 7a, 7b formed inside and loop-shaped polish preventing patterns 8, 9a, 9b, the isolation characteristics between element formation regions 2 are improved as compared with the case in which one loop-shaped polish preventing pattern has the same width as the combined width of loop-shaped polish preventing patterns 6, 7a, 7b, loop-shaped polish preventing patterns 8, 9a, 9b and the isolation oxide film.

Seventh Embodiment

Figure 20:
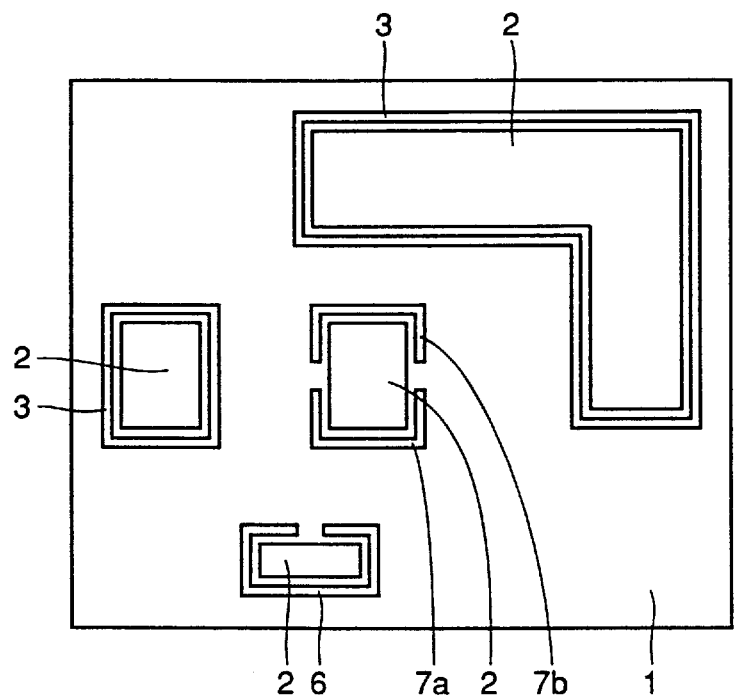
FIG. 20 is a plan view of a loop-shaped polish preventing pattern and a loop-shaped polish preventing pattern described in a seventh embodiment of the present invention are formed around an element formation region.

A semiconductor device having a polish preventing pattern in a seventh embodiment of the present invention will be described with reference to FIG. 20. In the semiconductor device in this embodiment, loop-shaped polish preventing pattern 3, loop-shaped polish preventing pattern 6 or loop-shaped polish preventing patterns 7a, 7b are formed in a uniform width and at a uniform distance from the outer edge of element formation region 2, as shown in FIG. 20. Element formation region 2 and loop-shaped polish preventing patterns 3, 6, 7a, 7b are formed by forming trenches in semiconductor substrate 1 so as to leave the surface of semiconductor substrate 1.

According to the structure, the effects of protection of element formation region 2 and electric connection between element formation regions, described in the first and fourth embodiments, can be utilized together.

Eighth Embodiment

Figure 21:
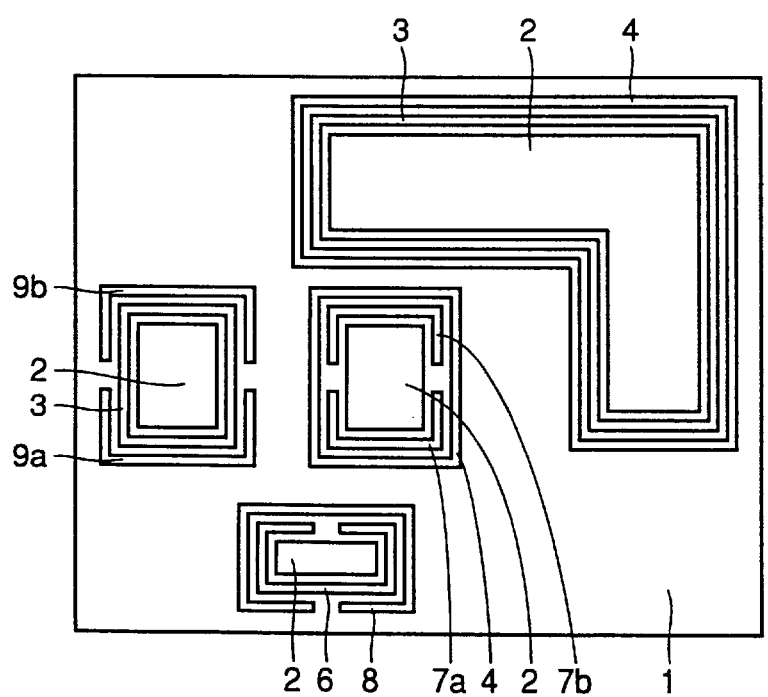
FIG. 21 is a plan view of a pattern in which a double loop-shaped polish preventing pattern and a loop-shaped polish preventing pattern having two discontinuous portions described in an eighth embodiment of the present invention are formed around an element formation region.

A semiconductor device having a polish preventing pattern in an eighth embodiment of the present invention will be described with reference to FIG. 21. In the semiconductor device in this embodiment, as shown in FIG. 21, loop-shaped polish preventing pattern 4, loop-shaped polish preventing pattern 8 having one discontinuous portion, or loop-shaped polish preventing patterns 9a, 9b having two discontinuous portions are formed in a uniform width and at a uniform distance from the outer edge of loop-shaped polish preventing pattern 3, loop-shaped polish preventing pattern 6 having one discontinuous portion, or loop-shaped polish preventing patterns 7a, 7b having two discontinuous portions, of the semiconductor device having a polish preventing pattern described in FIG. 20 of the seventh embodiment. Element formation region 2, loop-shaped polish preventing patterns 3, 4, 6, 7a, 7b, 8, 9a, 9b, and concavity formation preventing pattern 5 are formed by forming trenches in semiconductor substrate 1 so as to leave the surface of semiconductor substrate 1.

According to the structure, loop-shaped polish preventing pattern 3, loop-shaped polish preventing pattern 6 or loop-shaped polish preventing patterns 7a, 7b of the semiconductor device having a polish preventing pattern described in the seventh embodiment are polished, and therefore the possibility of polishing the end of element formation region 2 can be reduced. As a result, the planarity of the surface of element formation region 2 is further improved.

Ninth Embodiment

Figure 22:
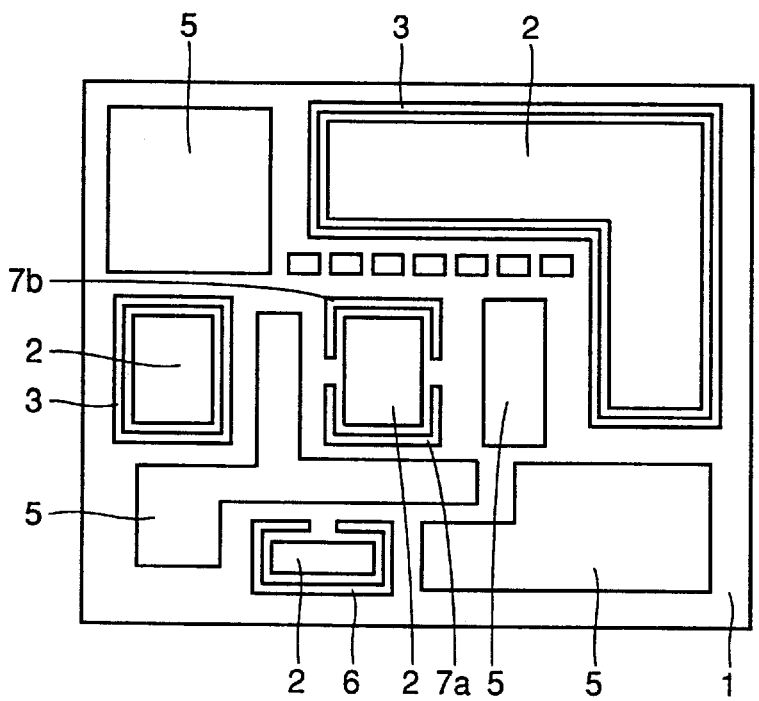
FIG. 22 is a plan view of a pattern in which a loop-shaped polish preventing pattern, an open-loop-shaped polish preventing pattern and a concavity formation preventing pattern described in a ninth embodiment of the present invention are formed around or outside an element formation region.

A semiconductor device having a polish preventing pattern in a ninth embodiment of the present invention will be described with reference to FIGS. 22 and 23. In the semiconductor device in this embodiment, loop-shaped polish preventing patterns 6, 7a, 7b and loop-shaped polish preventing pattern 3 are provided as shown in FIG. 20 in the seventh embodiment, and concavity formation preventing pattern 5 is further formed in a large area region to be an element isolation region, as shown in FIG. 22. Element formation region 2, loop-shaped polish preventing patterns 3, 6, 7a, 7b, and concavity formation preventing pattern 5 are formed by forming trenches in semiconductor substrate 1 so as to leave the surface of semiconductor substrate 1.

According to the structure, a semiconductor device can be provided in which the effects described in the seventh embodiment are attained and the effect of preventing a dented center of an isolation oxide film in an element formation region are attained.

Figure 23:
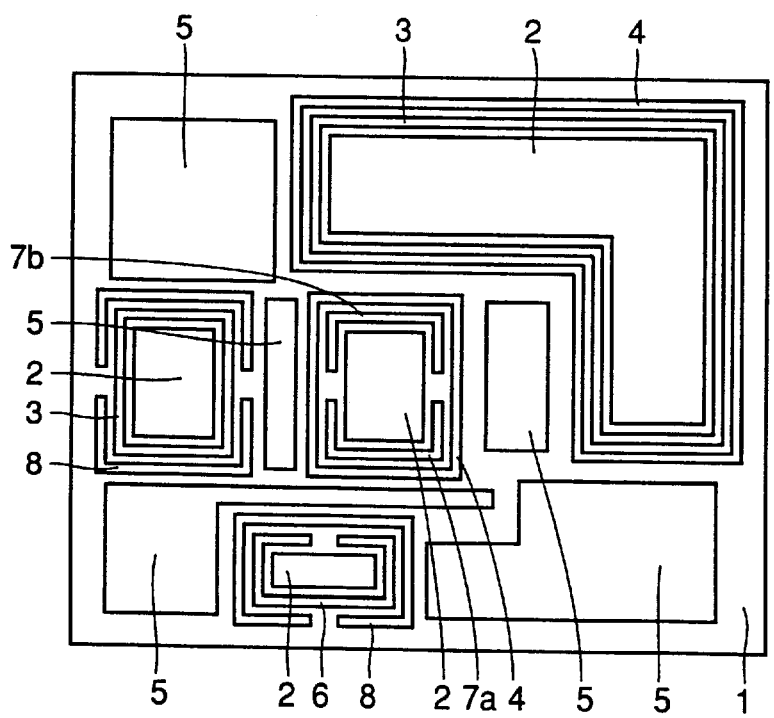
FIG. 23 is a plan view of a pattern in which the double loop-shaped polish preventing pattern and the concavity formation preventing pattern described in the ninth embodiment are formed around or outside an element formation region.

As shown in FIG. 23, the semiconductor device in this embodiment may further include loop-shaped polish preventing pattern 4, loop-shaped polish preventing pattern 8 or loop-shaped polish preventing patterns 9a, 9b in a uniform width and at a uniform distance from the outer edge of loop-shaped polish preventing pattern 3, the edge of loop-shaped polish preventing pattern 6, or the edge of loop-shaped polish preventing patterns 7a, 7b.

According to the structure, the possibility that the end of element formation region 2 is polished can further be reduced as described in the eighth embodiment, and therefore the planarity of the surface of element formation region 2 is further improved.

Tenth Embodiment

Figure 24:
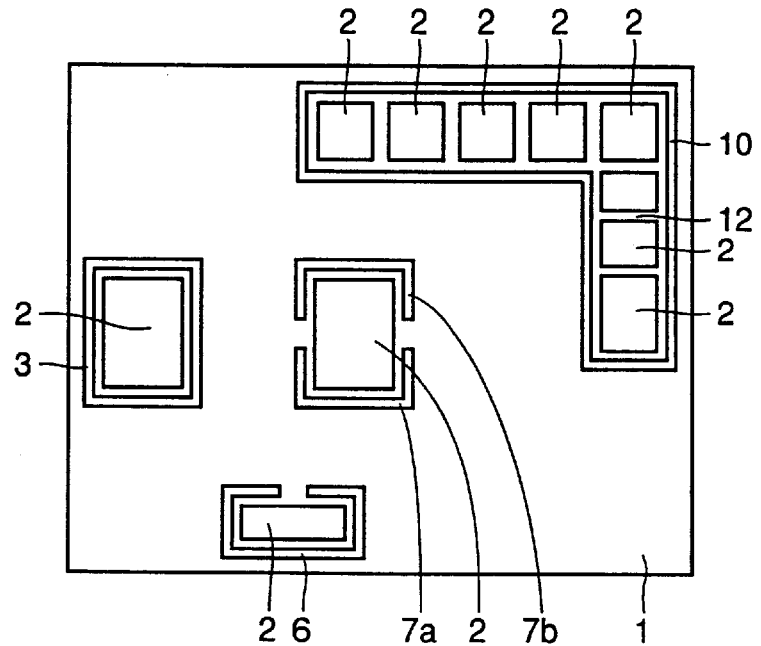
FIG. 24 is a plan view of a pattern in which a polish preventing pattern for potential fixation described in a tenth embodiment of the present invention is formed around a well in which a plurality of element formation regions are formed.

A semiconductor device having a polish preventing pattern in a tenth embodiment of the present invention will be described with reference to FIG. 24. In the semiconductor device in this embodiment, a plurality of element formation regions 2 are formed on the region of a well 12 as shown in FIG. 24. Further, a polish preventing pattern 10 for well fixation is formed to surround the outer edge of well 12 and the outer edges of a plurality of element formation regions 2. Element formation regions 2 and polish preventing pattern 10 for potential fixation are formed by forming trenches in semiconductor substrate 1 so as to leave the surface of semiconductor substrate 1.

According to the such a structure, when a contact hole that penetrates an interlayer oxide film, for example, is formed to connect a plug for fixing well 12 to a constant potential in a subsequent process, polish preventing pattern 10 for potential fixation is formed to have the same height as element formation region 2. Therefore, connection to polish preventing pattern 10 for potential fixation, as part of well 12, is easier than direct connection to well 12. Since polish preventing pattern 10 for potential fixation can also function as a pattern for preventing an element formation region from being polished in a polishing process by the CMP method, there is no need to provide another polish preventing pattern. Since the potential can accurately be fixed by connecting a plurality of plugs, for example, for potential fixation to the edge of well 12, a latch up phenomenon at a boundary surface of well 12 can be prevented.

Eleventh Embodiment

Figure 25:
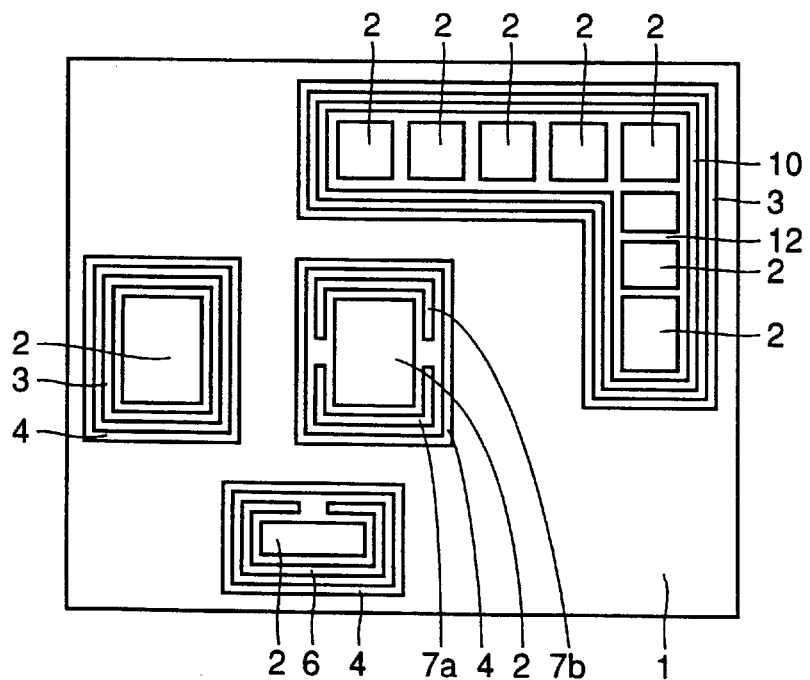
FIG. 25 is a plan view of a pattern in which a loop-shaped polish preventing pattern is formed around a polish preventing pattern for potential fixation described in an eleventh embodiment of the present invention.

A semiconductor having a polish preventing pattern in an eleventh embodiment of the present invention will be described with reference to FIG. 25. In semiconductor device in this embodiment, loop-shaped polish preventing pattern 3 is further formed outside polish preventing pattern 10 for potential fixation in the ninth embodiment shown in FIG. 24, as shown in FIG. 25.

According to the structure, element formation region polish preventing pattern 10 for potential fixation is prevented from being polished, which in turn prevents polishing of an end of element formation region 2. Thus, the planarity of the surface of element formation region 2 is further improved as compared with the tenth embodiment.

Twelfth Embodiment

Figure 26:
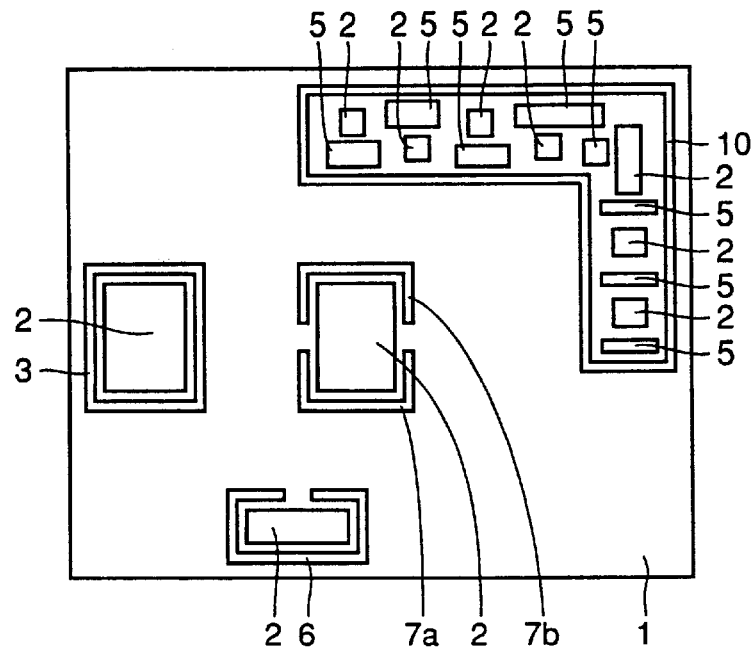
FIG. 26 is a plan view of a pattern in which a plurality of element formation regions are formed in a well, and a concavity formation preventing pattern is formed in a region of the well in which an element formation region is not formed, described in a twelfth embodiment of the present invention.

A semiconductor device having a polish preventing pattern is a twelfth embodiment of the present invention will be described with reference to FIG. 26. In the semiconductor device in this embodiment, , as shown in FIG. 26, concavity formation preventing pattern 5 is formed inside a region in which element formation region 2 is not formed inside polish preventing pattern 10 for potential fixation shown in FIG. 24 in the tenth embodiment, and element formation region 2 formed in well 12 is smaller than well 12, as an example.

According to the structure, a large area formed between element formation region 2 and polish preventing pattern 10 for potential fixation is occupied by concavity formation preventing pattern 5, and therefore concavity formation preventing pattern 5 can bear pressure from a polishing cloth in the CMP process. Accordingly, polishing of an end of element formation region 2 when large pressure of a polishing cloth is applied to the end of element formation region 2 is prevented, and element formation region 2 having a planar surface can be formed.

Although concavity formation preventing pattern 5 is formed in this embodiment, loop-shaped polish preventing patterns 3, 4 or loop-shaped polish preventing patterns 6, 7a, 7b, 8, 9a, 9b having a discontinuous portion may be formed.

Thirteenth Embodiment

Figure 27:
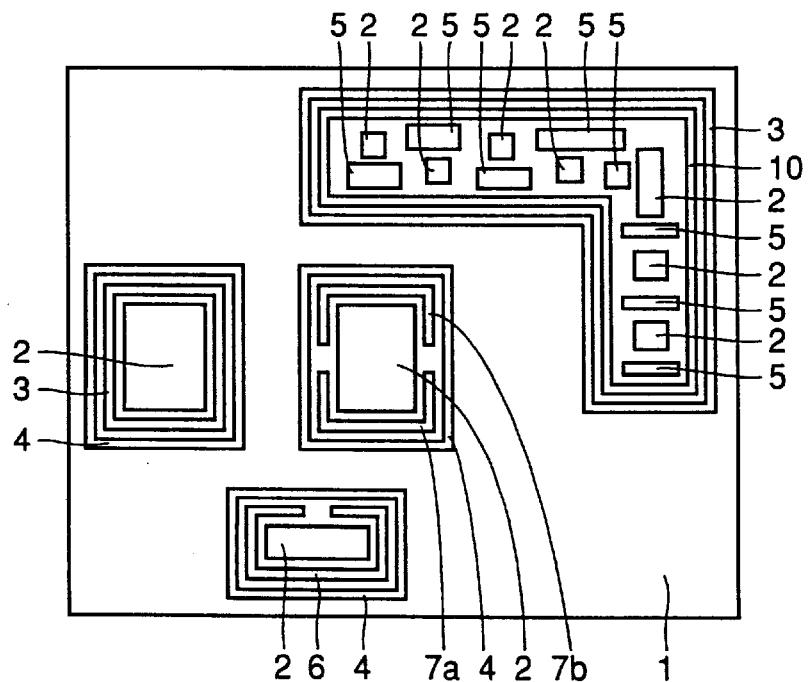
FIG. 27 is a plan view of a pattern in which a plurality of element formation regions are formed in a well, a concavity formation preventing pattern is formed in a region of the well in which an element formation region is not formed, and a polish preventing pattern is formed around a polish preventing pattern for potential fixation, described in a thirteenth embodiment of the present invention.

A semiconductor device having a polish preventing pattern in a thirteenth embodiment of the present invention will be described with reference to FIG. 27. In the semiconductor device in this embodiment, in addition to concavity formation preventing pattern 5 shown in FIG. 26 in the twelfth embodiment, loop-shaped polish preventing pattern 3 is formed at a uniform distance from the outer edge of polish preventing pattern 10 for potential fixation as shown in FIG. 27.

According to the structure, an end of element formation region 2 is prevented from being polished, and polish preventing pattern 10 for potential fixation that prevents polishing of the end of element formation region 2 is further protected by loop-shaped polish preventing pattern 3. Thus, the planarity of element formation region 2 after carrying out the CMP process is further improved.

Fourteenth Embodiment

A semiconductor device having a polish preventing pattern in a fourteenth embodiment of the present invention will be described with reference to FIGS. 28 and 29. In the semiconductor device on this embodiment, in addition to concavity formation preventing pattern 5 formed inside polish preventing pattern 10 for potential fixation shown in FIG. 26 of the twelfth embodiment, concavity formation preventing pattern 5 is formed at a uniform distance from the outer edge of polish preventing pattern 10 for potential fixation as shown in FIG. 28.

According to the structure, concavity formation preventing pattern 5 formed outside polish preventing pattern 10 for potential fixation prevents formation of a dent at the center of an isolation oxide film that is filled in an element isolation region having a large area after carrying out the CMP process. Thus, the planarity of the surface of element formation region 2 is further maintained as compared with the twelfth embodiment.

Figure 29:
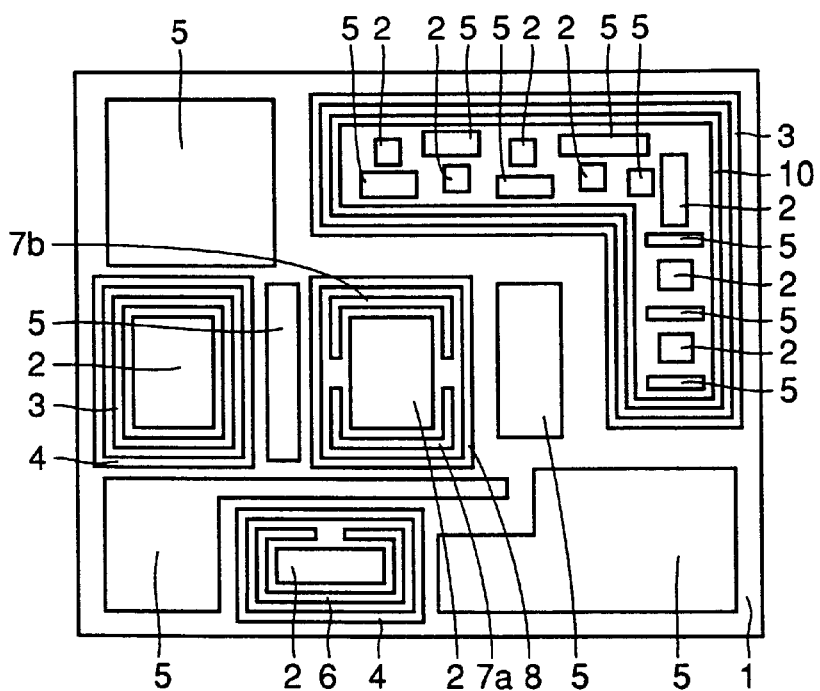
FIG. 29 is a plan view of a pattern in which a plurality of element formation regions are formed in a well, a concavity formation preventing pattern is formed in a region of the well in which an element formation region is not formed, a polish preventing pattern is formed around a polish preventing pattern for potential fixation, and a concavity formation preventing pattern is formed outside the polish preventing pattern for potential fixation, described in the fourteenth embodiment.

As shown in FIG. 29, the semiconductor device in this embodiment may have loop-shaped polish preventing pattern 3 formed at a uniform distance from the outer edge of polish preventing pattern 10 for potential fixation in addition to the polish preventing pattern shown in FIG. 27 in the thirteenth embodiment.

Figure 28:
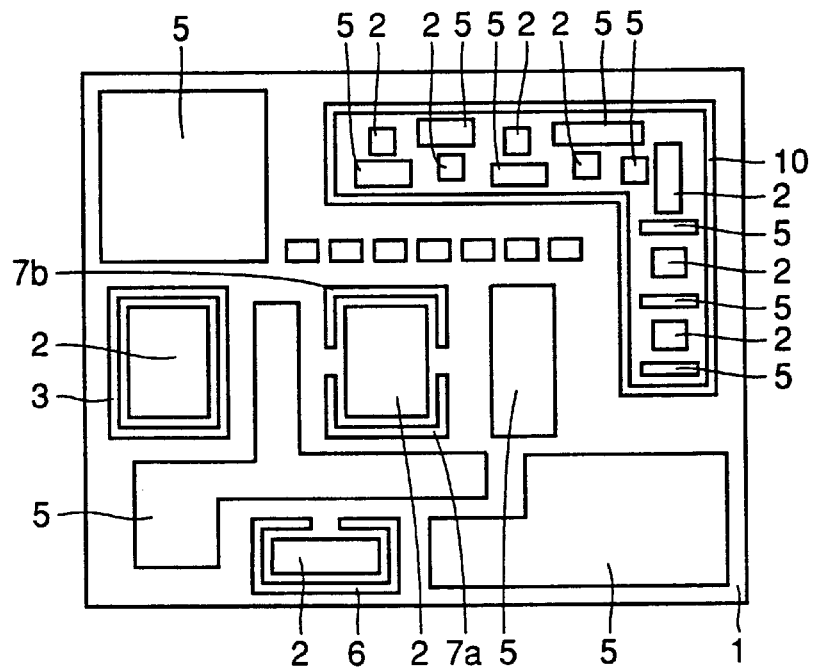
FIG. 28 is a plan view of a pattern in which a plurality of element formation regions are formed in a well, a concavity formation preventing pattern is formed in a region of the well in which an element formation region is not formed, and a concavity formation preventing pattern is formed outside a polish preventing pattern for potential fixation, described in a fourteenth embodiment of the present invention.

According to the structure, polish preventing pattern 10 for potential fixation is further prevented from being polished and the planarity of the surface of element formation region 2 is maintained more accurately than the pattern shown in FIG. 28.

Fifteenth Embodiment

Figure 30:
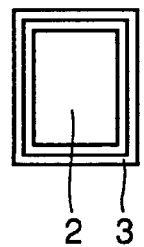
FIG. 30 is a plan view showing a state in which a loop-shaped polish preventing pattern having an opposite conductivity type from that of a well is formed, described in a fifteenth embodiment of the present invention.

A semiconductor device having a polish preventing pattern in a fifteenth embodiment of the present invention will be described with reference to FIG. 30. In the semiconductor device in this embodiment, as shown in FIG. 30, loop-shaped polish preventing pattern 3 of the same conductivity type as a well is formed in the well region and around element formation region 2, as source/drain regions, at a uniform distance from the outer edge of the element formation region. In short, polish preventing pattern 3 formed on a p well has a p type while polish preventing pattern 3 formed on an n well has an n type. Element formation region 2 and loop-shaped polish preventing pattern 3 are formed by forming trenches so as to leave the surface of semiconductor substrate 1.

According to the structure, polish preventing pattern 3 can be maintained to have the same conductive type as a well.

Sixteenth Embodiment

Figure 31:
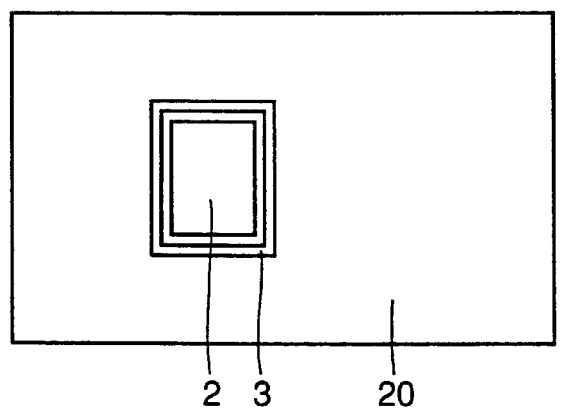
FIG. 31 is a plan view showing a state in which a loop-shaped polish preventing pattern having the same conductivity type as a well is formed, described in a sixteenth embodiment of the present invention.

A semiconductor device having a polish preventing pattern in a sixteen embodiment of the present invention will be described with reference to FIG. 31. In the semiconductor device in this embodiment, element formation region 2 is formed in the region of a well 20 as shown in FIG. 31. Further, polish preventing pattern 3 is provided at a uniform distance from the outer edge of element formation region 2. The conductivity type of polish preventing pattern 3 is fixed in potential to an opposite conductivity type.

According to the structure, the potential of well 20 can be fixed while it is varied from it is when well 20 is formed by a build-in potential formed at a junction between polish preventing pattern 3 and well 20.

Seventeenth Embodiment

Figure 32:
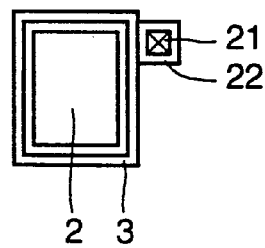
FIG. 32 is a plan view showing a state in which a loop-shaped polish preventing pattern is formed around an element formation region and the loop-shaped polish preventing pattern is fixed in potential, described in a seventeenth embodiment of the present invention.

A semiconductor device having a polish preventing pattern in a seventeenth embodiment of the present invention will be described with reference to FIG. 32. In the semiconductor device in this embodiment, loop-shaped polish preventing pattern 3 having a uniform width is formed around element formation region 2 at a uniform distance from element formation region 2 as shown in FIG. 32. A polish preventing pattern 22 for connection is formed outside loop-shaped polish preventing pattern 3 to be in contact with loop-shaped polish preventing pattern 3, a contact plug 21 is connected to polish preventing pattern 22 for connection, and the conductivity type of polish preventing pattern 3 is fixed to an opposite conductivity type of element formation region 2.

According to the structure, polish preventing pattern 3 can be maintained to an opposite conductivity type from that of element formation region 2 because an electric charge is supplied from the contact plug.

Eighteenth Embodiment

Figure 33:
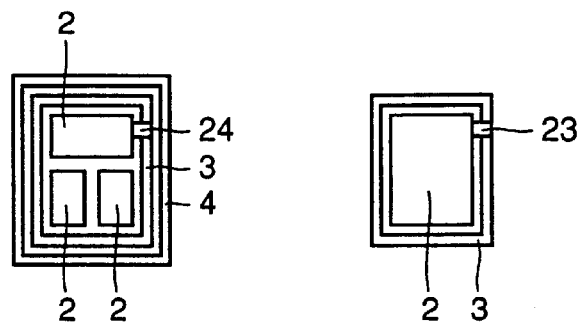
FIG. 33 is a plan view showing a state in which a loop-shaped polish preventing pattern is formed around an element formation region and the loop-shaped polish preventing pattern and the element formation region are electrically connected, described in an eighteenth embodiment of the present invention.

A semiconductor device having a polish preventing pattern in an eighteenth embodiment of the present invention will be described with reference to FIG. 33. In the semiconductor device in this embodiment, loop-shaped polish preventing pattern 3 and loop-shaped polish preventing pattern 4 of the same conductivity type as element formation region 2 are formed in a uniform width and at a uniform distance from the outer edges of three element formation regions 2 on the left side, as shown in FIG. 33. Further, loop-shaped polish preventing pattern 3 is formed in a uniform width and at a uniform distance from the outer edge of element formation region 2 on the right side to have the same conductivity type as element formation region 2. Further, polish preventing patterns 23, 24 are formed which electrically connect loop-shaped polish preventing patterns 3 and 4 to element formation region 2. Since the conductivity type of the well is opposite from that of element formation region 2 at this time, the conductivity type of loop-shaped polish preventing pattern 3, 4 is opposite from that of the well.

According to the structure, loop-shaped polish preventing patterns 3, 4 are connected to element formation region 2 through polish preventing patterns 23, 24 for connection. Thus, the potential is fixed by the element formation region and the conductivity type opposite from that of the well can be maintained.

Nineteenth Embodiment

Figure 34:
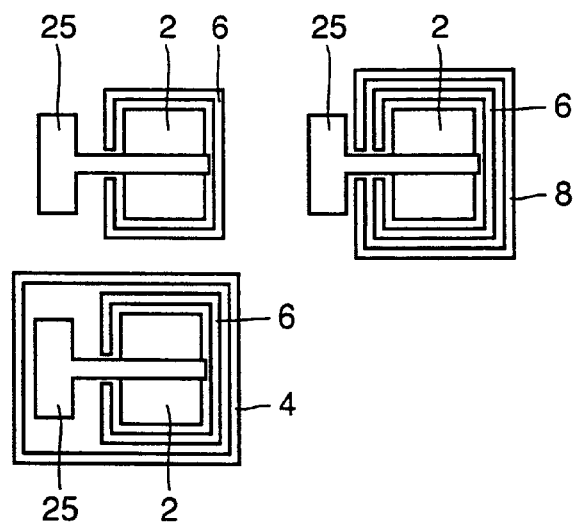
FIG. 34 is a plan view showing a state in which an open-loop-shaped polish preventing pattern is formed around an element formation region and a gate electrode is formed to cross an opening region of the loop-shaped polishing preventing pattern, described in a nineteenth embodiment of the present invention.

A semiconductor device having a polish preventing pattern in a nineteenth embodiment of the present invention will be described with reference to FIG. 34. In the semiconductor device in this embodiment, loop-shaped polish preventing patterns 6, 8 having one discontinuous portion are formed in a uniform width and at a uniform distance from the outer edge of element formation region 2 so that a gate electrode 25 formed on an isolation oxide film can connect element formation region 2 to another element formation region or an interconnection layer when gate electrode 25 is formed in element formation region 2, as shown in FIG. 34.

According to the structure, gate electrode 25 can be provided to cross over the isolation oxide film of an opening portion of loop-shaped polish preventing patterns 6, 8 even when gate electrode 25 connects element formation region 2 to another element formation region or an interconnection layer. Accordingly, electric connection between gate electrode 25 and polish preventing patterns 6, 8 can be prevented. As a result, the potential of loop-shaped polish preventing patterns 6, 8 can be prevented from being fixed to the same potential as element formation region 2 and gate electrode 25.

Twentieth Embodiment

Figure 35:
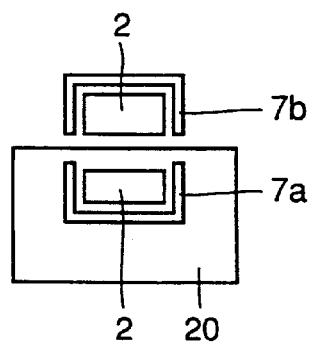
FIG. 35 is a plan view showing a state in which a loop-shaped polish preventing pattern is formed around an element formation region not to cross a well boundary, described in a twentieth embodiment of the present invention.

A semiconductor device having a polish preventing pattern in a twentieth embodiment of the present invention will be described with reference to FIG. 35. In the semiconductor device in this embodiment, loop-shaped polish preventing patterns 7a, 7b having two discontinuous portions are formed inside and outside, respectively, of well 20 to prevent continuous provision of well 20 on the both sides of the boundary.

According to the structure, loop-shaped polish preventing patterns 7a, 7b are electrically disconnected, and therefore a latch up phenomenon due to the operation of a hole caused at a boundary surface between well 20 and a region around it can be suppressed.

Twenty-First Embodiment

Figure 36:
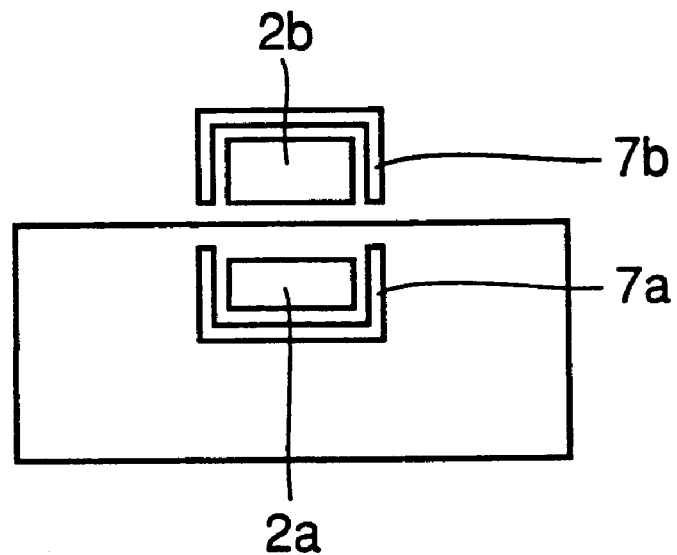
FIG. 36 is a plan view of a pattern in which a loop-shaped polish preventing pattern is formed around an element formation region not to cross a boundary between source/drain regions, described in a twenty-first embodiment of the present invention.

A semiconductor device having a polish preventing pattern in a twenty-first embodiment of the present invention will be described with reference to FIG. 36. In the semiconductor device in this embodiment, polish preventing patterns 7a, 7b are formed to prevent continuous provision of source/drain regions 2a, 2b on the both sides of the boundary, as shown in FIG. 36.

According to the structure, the isolation characteristics of source/drain regions 2a, 2b can be prevented from being lowered, which is caused when one source/drain region 2a is electrically connected to the other source/drain region 2b through a polish preventing pattern.

Twenty-Second Embodiment

Figure 37:
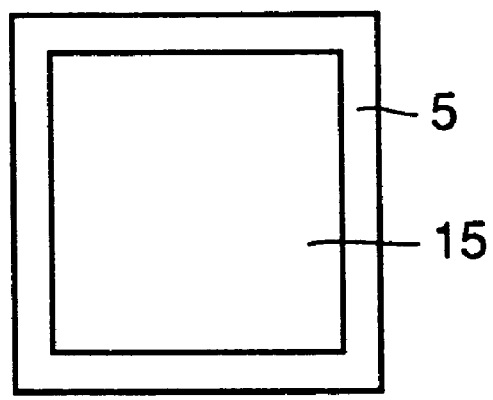
FIG. 37 is a plan view showing a state in which a concavity formation preventing pattern described in a twenty-second embodiment of the present invention is formed under an electrode pad.
Figure 38:
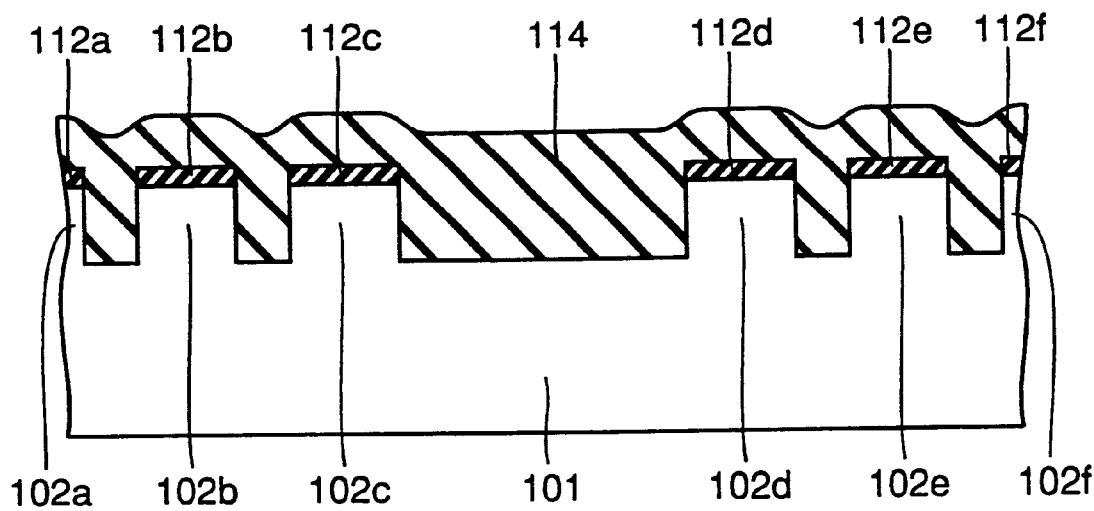
FIG. 38 is a cross sectional view showing a state in which an insulation film is greatly dented at a portion without a polish preventing pattern in a process of polishing an insulation film to form an element isolation region using the conventional CMP method.

A semiconductor device having a polish preventing pattern in a twenty-second embodiment of the present invention will be described with reference to FIG. 37. In the semiconductor device in this embodiment, concavity formation preventing pattern 5 is formed under electrode pad 15 as shown in FIG. 37. In short, electrode pad 15 is formed on the region in which concavity formation preventing pattern 5 is formed.

According to the structure, the possibility of formation of a capacitor having a parasitic capacitance caused when electrode pad 15 is provided close to another conductive region such as an element formation region can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising a polish preventing pattern surrounding an element formation region, formed at a main surface of a semiconductor substrate, in a substantially continuous manner at an almost uniform distance horizontally from an outer edge of said element formation region.

2. The semiconductor device according to claim 1, wherein
said polish preventing pattern includes a remainder of said main surface of said semiconductor substrate, which is adjacent to a trench formed around said element formation region at said main surface of said semiconductor substrate.

3. The semiconductor device according to claim 2, wherein
an insulation film is filled in said trench between the outer edge of said element formation region and said polish preventing pattern.

4. The semiconductor device according to claim 1, wherein
said polish preventing pattern is formed at a prescribed distance from a conductive layer.

5. The semiconductor device according to claim 1, wherein
said polish preventing pattern is formed at a prescribed distance from a boundary of an impurity diffusion region.

6. The semiconductor device according to claim 1, wherein
said polish preventing pattern further includes a polish preventing pattern for well-potential fixation formed to horizontally surround a well and fixed in potential by another electrode to fix the well potential.

7. The semiconductor device according to claim 1, wherein
said polish preventing pattern includes a loop-shaped polish preventing pattern extending in a band shape.

8. The semiconductor device according to claim 7, wherein
said polish preventing pattern includes a concavity formation preventing pattern formed at a distance from said loop-shaped polish preventing pattern with an insulation film therebetween.

9. The semiconductor device according to claim 8, wherein
a pad for receiving signals is further formed on said concavity formation preventing pattern.

10. The semiconductor device according to claim 7, wherein
said loop-shaped polish preventing pattern has a discontinuous portion.

11. The semiconductor device according to claim 7, wherein
said polish preventing pattern includes another loop-shaped polish preventing pattern outside said loop-shaped polish preventing pattern.

* * * * *